United States Patent
Kimura et al.

(10) Patent No.: US 10,468,531 B2
(45) Date of Patent: Nov. 5, 2019

(54) SEMICONDUCTOR DEVICE AND MANUFACTURING METHOD OF THE SAME

(71) Applicant: Semiconductor Energy Laboratory Co., Ltd., Atsugi-shi, Kanagawa-ken (JP)

(72) Inventors: Kunio Kimura, Ebina (JP); Mitsuhiro Ichijo, Zama (JP); Toshiya Endo, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/293,434

(22) Filed: Oct. 14, 2016

(65) Prior Publication Data

US 2017/0033234 A1 Feb. 2, 2017

Related U.S. Application Data

(62) Division of application No. 13/099,613, filed on May 3, 2011, now Pat. No. 9,490,368.

(30) Foreign Application Priority Data

May 20, 2010 (JP) ................................. 2010-116016

(51) Int. Cl.
*H01L 29/786* (2006.01)
*H01L 21/316* (2006.01)
(Continued)

(52) U.S. Cl.
CPC .... *H01L 29/78606* (2013.01); *H01L 21/3003* (2013.01); *H01L 21/31629* (2013.01);
(Continued)

(58) Field of Classification Search
CPC ............. G02F 1/13345; G02F 1/13394; G02F 1/134309; G02F 1/1368; H01L 29/78606;
(Continued)

(56) References Cited

U.S. PATENT DOCUMENTS 4,957,554 A * 9/1990 Mathers ................ C04B 35/195
106/35
5,731,856 A 3/1998 Kim et al.
(Continued)

FOREIGN PATENT DOCUMENTS

CN 101621076 A 1/2010
EP 1737044 A 12/2006
(Continued)

OTHER PUBLICATIONS

Korean Office Action (Application No. 2012-7030989) dated Mar. 14, 2017.
(Continued)

*Primary Examiner* — Galina G Yushina
(74) *Attorney, Agent, or Firm* — Robinson Intellectual Property Law Office; Eric J. Robinson

(57) ABSTRACT

One object is to provide a semiconductor device including an oxide semiconductor, which has stable electric characteristics and high reliability. Another object is to manufacture a highly reliable semiconductor device in a high yield. In a top-gate staggered transistor including an oxide semiconductor film, as a first gate insulating film in contact with the oxide semiconductor film, a silicon oxide film is formed by a plasma CVD method with use of a deposition gas containing silicon fluoride and oxygen; and as a second gate insulating film stacked over the first gate insulating film, a silicon oxide film is formed by a plasma CVD method with use of a deposition gas containing silicon hydride and oxygen.

16 Claims, 12 Drawing Sheets

(51) Int. Cl.
*H01L 21/30* (2006.01)
*H01L 29/49* (2006.01)
*H01L 27/12* (2006.01)
*H01L 29/423* (2006.01)
*H01L 29/66* (2006.01)
*H01L 27/146* (2006.01)
*G02F 1/1333* (2006.01)
*G02F 1/1339* (2006.01)
*G02F 1/1343* (2006.01)
*G02F 1/1368* (2006.01)
*H01L 27/32* (2006.01)

(52) U.S. Cl.
CPC .... *H01L 27/1225* (2013.01); *H01L 27/14616* (2013.01); *H01L 29/42384* (2013.01); *H01L 29/4908* (2013.01); *H01L 29/66969* (2013.01); *H01L 29/7869* (2013.01); *H01L 29/78696* (2013.01); *G02F 1/1368* (2013.01); *G02F 1/13394* (2013.01); *G02F 1/133345* (2013.01); *G02F 1/134309* (2013.01); *G02F 2203/64* (2013.01); *H01L 27/3262* (2013.01)

(58) Field of Classification Search
CPC .......... H01L 29/42384; H01L 29/4908; H01L 29/7869; H01L 29/66969; H01L 21/31629; H01L 21/3003; H01L 27/1225; H01L 27/14616; H01L 27/3262; H01L 29/78696
See application file for complete search history.

(56) References Cited

U.S. PATENT DOCUMENTS

| | | | |
|---|---|---|---|
| 5,740,226 A * | 4/1998 | Komiya | G01N 23/20 378/70 |
| 5,744,864 A | 4/1998 | Cillessen et al. | |
| 5,946,542 A | 8/1999 | Iyer | |
| 6,018,182 A | 1/2000 | Morosawa | |
| 6,037,274 A * | 3/2000 | Kudo | C23C 16/401 257/E21.276 |
| 6,165,873 A | 12/2000 | Hamada | |
| 6,166,794 A * | 12/2000 | Sung | G02F 1/1368 349/138 |
| 6,191,463 B1 | 2/2001 | Mitani et al. | |
| 6,228,751 B1 | 5/2001 | Yamazaki et al. | |
| 6,288,433 B1 | 9/2001 | Akram et al. | |
| 6,294,274 B1 | 9/2001 | Kawazoe et al. | |
| 6,563,174 B2 | 5/2003 | Kawasaki et al. | |
| 6,593,196 B2 | 7/2003 | Akram et al. | |
| 6,703,264 B2 | 3/2004 | Yamazaki et al. | |
| 6,727,522 B1 | 4/2004 | Kawasaki et al. | |
| 6,731,064 B2 | 5/2004 | Andry et al. | |
| 6,939,779 B2 | 9/2005 | Takahashi | |
| 6,952,020 B1 * | 10/2005 | Yamazaki | G02F 1/13454 257/59 |
| 7,001,854 B1 | 2/2006 | Papasouliotis et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,411 B1 | 9/2006 | Akram et al. | |
| 7,105,868 B2 | 9/2006 | Nause et al. | |
| 7,189,623 B2 | 3/2007 | Akram et al. | |
| 7,211,825 B2 | 5/2007 | Shih et al. | |
| 7,245,018 B1 * | 7/2007 | Takayama | C23C 14/165 257/763 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,393,723 B2 | 7/2008 | Yamazaki et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,906,777 B2 | 3/2011 | Yano et al. | |
| 7,910,920 B2 | 3/2011 | Park et al. | |
| 8,129,717 B2 | 3/2012 | Yamazaki et al. | |
| 8,129,719 B2 | 3/2012 | Yamazaki et al. | |
| 8,293,595 B2 | 10/2012 | Yamazaki et al. | |
| 8,389,991 B2 | 3/2013 | Morosawa et al. | |
| 8,502,217 B2 | 8/2013 | Sato et al. | |
| 8,614,442 B2 | 12/2013 | Park et al. | |
| 8,729,544 B2 | 5/2014 | Yamazaki et al. | |
| 8,822,264 B2 | 9/2014 | Yamazaki et al. | |
| 8,841,710 B2 | 9/2014 | Yamazaki et al. | |
| 9,082,857 B2 | 7/2015 | Yamazaki et al. | |
| 9,196,713 B2 | 11/2015 | Yamazaki et al. | |
| 9,397,194 B2 | 7/2016 | Yamazaki et al. | |
| 9,412,798 B2 | 8/2016 | Yamazaki et al. | |
| 9,859,441 B2 | 1/2018 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0186330 A1 * | 12/2002 | Kawasaki | G02F 1/13458 349/43 |
| 2003/0122175 A1 * | 7/2003 | Buskirk | H01L 23/5223 257/310 |
| 2003/0159656 A1 | 8/2003 | Tan et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0120685 A1 | 6/2004 | Breitung | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0250286 A1 | 11/2005 | Paik | |
| 2006/0011995 A1 | 1/2006 | Yamazaki et al. | |
| 2006/0035452 A1 | 2/2006 | Carcia et al. | |
| 2006/0043377 A1 | 3/2006 | Hoffman et al. | |
| 2006/0046519 A1 * | 3/2006 | Tsuji | C23C 16/401 438/778 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 * | 11/2006 | Sugihara | H01L 29/7869 257/646 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0020868 A1 | 1/2007 | Akram et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0063227 A1 * | 3/2007 | Tsubata | H01L 29/7866 257/213 |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0181960 A1 * | 8/2007 | Miyata | H01L 21/28194 257/411 |

(56) References Cited

U.S. PATENT DOCUMENTS

| | | |
|---|---|---|
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0165854 A1 | 7/2009 | Yamazaki et al. |
| 2009/0184315 A1 | 7/2009 | Lee et al. |
| 2009/0278122 A1 | 11/2009 | Hosono et al. |
| 2009/0280600 A1 | 11/2009 | Hosono et al. |
| 2009/0321732 A1* | 12/2009 | Kim .................. H01L 29/78606 257/43 |
| 2010/0025677 A1 | 2/2010 | Yamazaki et al. |
| 2010/0025678 A1 | 2/2010 | Yamazaki et al. |
| 2010/0032665 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163862 A1 | 7/2010 | Yang et al. |
| 2012/0108006 A1 | 5/2012 | Yamazaki et al. |
| 2012/0108007 A1 | 5/2012 | Yamazaki et al. |
| 2012/0126376 A1* | 5/2012 | Honda .................. C23C 16/402 257/632 |
| 2016/0079439 A1 | 3/2016 | Yamazaki et al. |
| 2016/0268437 A1 | 9/2016 | Yamazaki et al. |

FOREIGN PATENT DOCUMENTS

| | | | |
|---|---|---|---|
| EP | 2141744 | A | 1/2010 |
| EP | 2159845 | A | 3/2010 |
| EP | 2226847 | A | 9/2010 |
| JP | 60-198861 | A | 10/1985 |
| JP | 61-248432 | A | 11/1986 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 07-090589 | A | 4/1995 |
| JP | 08-264794 | A | 10/1996 |
| JP | 09-307116 | A | 11/1997 |
| JP | 10-065173 | A | 3/1998 |
| JP | 10-340897 | A | 12/1998 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2003-174037 | A | 6/2003 |
| JP | 2004-103957 | A | 4/2004 |
| JP | 2004-172325 | A | 6/2004 |
| JP | 2004-273614 | A | 9/2004 |
| JP | 2004-273732 | A | 9/2004 |
| JP | 2004-319673 | A | 11/2004 |
| JP | 2006-165528 | A | 6/2006 |
| JP | 2007-073562 | A | 3/2007 |
| JP | 2007-073959 | A | 3/2007 |
| JP | 2007-142196 | A | 6/2007 |
| JP | 2007-194594 | A | 8/2007 |
| JP | 2007-294672 | A | 11/2007 |
| JP | 2008-060419 | A | 3/2008 |
| JP | 2008-205469 | A | 9/2008 |
| JP | 2009-141002 | A | 6/2009 |
| JP | 2010-016347 | A | 1/2010 |
| JP | 2010-056546 | A | 3/2010 |
| JP | 2010-062229 | A | 3/2010 |
| JP | 2010-080947 | A | 4/2010 |
| JP | 2010-080952 | A | 4/2010 |
| JP | 2011-119355 | A | 6/2011 |
| KR | 2001-0033261 | A | 4/2001 |
| KR | 2010-0002503 | A | 1/2010 |
| WO | WO-1999/031732 | | 6/1999 |
| WO | WO-2004/114391 | | 12/2004 |
| WO | WO-2009/072532 | | 6/2009 |

OTHER PUBLICATIONS

Kim.S et al., "High-Performance oxide thin film transistors passivated by various gas plasmas", 214th ECS Meeting, 2008, No. 2317, ECS.

Kanno.H et al., "White Stacked Electrophosphorecent Organic Light-Emitting Devices Employing MoO3 as a Charge-Generation Layer", Adv. mater. (Advanced Materials), 2006, vol. 18, No. 3, pp. 339-342.

Park.J et al., "Amorphous Indium-Gallium-Zinc Oxide TFTs and Their Application for Large size AMOLED", AM-FPD '08 Digest of Technical Papers, Jul. 2, 2008, pp. 275-278.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et al., "Oxygen Vacancies in ZnO", Appl. Phys. Lett. (Applied Physics Letters), 2005, vol. 87, pp. 122102-1-122102-3.

Park.J et al., "Improvements in the Device Characteristics of Amorphous Indium Gallium Zinc Oxide Thin-film Transistors by Ar

(56) References Cited

OTHER PUBLICATIONS

Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Tsuda.K et al., "Ultra Low Power Consumption Technologies for Mobile TFT-LCDs", IDW '02 : Proceedings of the 9th International Display Workshops, Dec. 4, 2002, pp. 295-298.

Lee.H et al., "Current Status of, Challenges to, and Perspective View of AM-OLED", IDW '06 Proceedings of the 13th International Display Workshops, Dec. 7, 2006, pp. 663-666.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Mo.Y et al., "Amorphous Oxide TFT Backplanes for Large Size AMOLED Displays", IDW '08 : Proceedings of the 6th International Display Workshops, Dec. 3, 2008, pp. 581-584.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Park.J et al., "High performance amorphous oxide thin film transistors with self-aligned top-gate structure", IEDM 09: Technical Digest of International Electron Devices Meeting, Dec. 7, 2009, pp. 191-194.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Park.S et al., "Challenge to Future Displays: Transparent AM-OLED Driven by PEALD Grown ZnO TFT", IMID '07 Digest, 2007, pp. 1249-1252.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 156, No. 12, pp. H1009-H1014.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp, 181-184.

Kimizuka.N et al., "Spinel, YbFe2O4, and Yb2Fe3O7 Types of Structures for Compounds in the In2O3 and Sc2Oc—A2O3-BO Systems [A; Fe, Ga, or Al; B: Mg, Mn, Fe, Ni, Cu,or Zn] at temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System", Journal of Solid State Chemistry, Apr. 1, 1995, vol. 116, No. 1, pp. 170-178.

Kurokawa.Y et al., "UHF RFCPUS on Flexible and Glass Substrates for Secure RFID Systems", Journal of Solid-State Circuits, 2008, vol. 43, No. 1, pp. 292-299.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Kitzerow.H et al., "Observation of Blue Phases in Chiral Networks", Liquid Crystals, 1993, vol. 14, No. 3, pp. 911-916.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Kikuchi.H et al., "Polymer-Stabilized Liquid Crystal Blue Phases", Nature Materials, Sep. 2, 2002, vol. 1, pp. 64-68.

Nakamura.M, "Synthesis of Homologous Compound with New Long-Period Structure", NIRIM Newsletter, Mar. 1, 1995, vol. 150, pp. 1-4.

Orita.M et al., "Amorphous transparent conductive oxide InGaO3(ZnO)m (m<4):a Zn4s conductor", Philosophical Magazine, 2001, vol. 81, No. 5, pp. 501-515.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Janotti.A et al., "Native Point Defects in ZnO", Phys. Rev. B (Physical Review. B), Oct. 4, 2007, vol. 76, No. 16, pp. 165202-1-165202-22.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Miyasaka.M, "SUFTLA Flexible Microelectronics on Their Way to Business", SID Digest '07 : SID International Symposium Digest of Techical Papers, 2007, vol. 38, pp. 1673-1676.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Asaoka.Y et al., "29.1:Polarizer-Free Reflective LCD Combined With Ultra Low-Power Driving Technology", SID Digest '09 : SID Internatioan Digest of Technical Papers, May 31, 2009, pp. 395-398.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Clark.S et al., "First Principles Methods Using CASTEP", Zeitschrift fur Kristallographie, 2005, vol. 220, pp. 567-570.

International Search Report (Application No. PCT/JP2011/061353) dated Aug. 16, 2011.

Written Opinion (Application No. PCT/JP2011/061353) dated Aug. 16, 2011.

Zhang.J et al., "Creation of SiOF films with SiF4/O2 plasmas: From gas-surface interactions to film formation", J. Appl. Phys. (Journal of Applied Physics) , Jul. 15, 2004, vol. 96, No. 2, pp. 1094-1103.

Taiwanese Office Action (Application No. 100116671) dated Jun. 23, 2015.

Korean Office Action (Application No. 2017-7037025) dated Jul. 30, 2018.

* cited by examiner

SEMICONDUCTOR DEVICE AND MANUFACTURING METHOD OF THE SAME

TECHNICAL FIELD

The present invention relates to a semiconductor device and a manufacturing method of the semiconductor device.

Note that semiconductor devices in this specification refer to all devices which can function by utilizing semiconductor characteristics; electro-optical devices, semiconductor circuits, and electronic devices are all included in the category of semiconductor devices.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (a display device). A silicon-based semiconductor material is widely known as a material for a semiconductor thin film applicable to a transistor; in addition, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

DISCLOSURE OF INVENTION

However, the electric conductivity of an oxide semiconductor changes when hydrogen or moisture forming an electron donor enters the oxide semiconductor during a manufacturing process of a device including the oxide semiconductor. Such a phenomenon becomes a factor of variation in the electric characteristics of a transistor including an oxide semiconductor.

In view of the above problems, one object is to provide a semiconductor device including an oxide semiconductor, which has stable electric characteristics and high reliability.

Another object is to manufacture a highly reliable semiconductor device in a high yield.

In a top-gate staggered transistor (also referred to as a forward-staggered transistor) including an oxide semiconductor film, as a first gate insulating film in contact with the oxide semiconductor film, a silicon oxide film is formed by a plasma chemical vapor deposition method (a plasma CVD method) with use of a deposition gas containing silicon fluoride and oxygen; and as a second gate insulating film stacked over the first gate insulating film, a silicon oxide film is formed by a plasma CVD method with use of a deposition gas containing silicon hydride and oxygen.

One embodiment of the invention disclosed in this specification is a semiconductor device including an insulating film; a source electrode layer and a drain electrode layer over the insulating film; an island-shaped oxide semiconductor film over the insulating film, the source electrode layer, and the drain electrode layer; an island-shaped first gate insulating film over and in contact with the island-shaped oxide semiconductor film; a second gate insulating film over the insulating film, the source electrode layer, the drain electrode layer, the island-shaped oxide semiconductor film, and the island-shaped first gate insulating film to cover the insulating film, the source electrode layer, the drain electrode layer, and the island-shaped first gate insulating film; and a gate electrode layer over the second gate insulating film which overlaps with the island-shaped oxide semiconductor film, in which the island-shaped first gate insulating film is a silicon oxide film including fluorine, the second gate insulating film includes hydrogen, and a hydrogen concentration of the second gate insulating film is higher than a hydrogen concentration of the first gate insulating film.

One embodiment of the invention disclosed in this specification is a semiconductor device including an insulating film; a source electrode layer and a drain electrode layer over the insulating film; an island-shaped oxide semiconductor film over the insulating film, the source electrode layer, and the drain electrode layer; an island-shaped first gate insulating film over and in contact with the island-shaped oxide semiconductor film; a second gate insulating film over the insulating film, the source electrode layer, the drain electrode layer, the island-shaped oxide semiconductor film, and the island-shaped first gate insulating film to cover the insulating film, the source electrode layer, the drain electrode layer, and the island-shaped first gate insulating film; and a gate electrode layer over the second gate insulating film which overlaps with the island-shaped oxide semiconductor film, in which the island-shaped first gate insulating film is a silicon oxide film including fluorine, the second gate insulating film includes hydrogen, a hydrogen concentration of the second gate insulating film is higher than a hydrogen concentration of the first gate insulating film, and the insulating film is a silicon oxide film including fluorine.

One embodiment of the invention disclosed in this specification is a manufacturing method of a semiconductor device, including the steps of forming an insulating film; forming a source electrode layer and a drain electrode layer over the insulating film; forming an oxide semiconductor film covering the insulating film, the source electrode layer, and the drain electrode layer; forming a first gate insulating film over and in contact with the oxide semiconductor film by a plasma chemical vapor deposition method with use of a deposition gas containing silicon fluoride and oxygen; processing the oxide semiconductor film and the first gate insulating film into an island-shaped oxide semiconductor film and an island-shaped first gate insulating film; forming a second gate insulating film by a plasma chemical vapor deposition method with use of a deposition gas containing silicon hydride and oxygen over the insulating film, the source electrode layer, the drain electrode layer, the island-shaped oxide semiconductor film, and the island-shaped first gate insulating film to cover the insulating film, the source electrode layer, the drain electrode layer, and the island-shaped first gate insulating film; and forming a gate electrode layer over the second gate insulating film overlapping with the oxide semiconductor film.

One embodiment of the invention disclosed in this specification is a manufacturing method of a semiconductor device, including the steps of forming an insulating film by a plasma chemical vapor deposition method with use of a deposition gas containing silicon fluoride and oxygen; forming a source electrode layer and a drain electrode layer over the insulating film; forming an oxide semiconductor film covering the insulating film, the source electrode layer, and the drain electrode layer; forming a first gate insulating film over and in contact with the oxide semiconductor film by a plasma chemical vapor deposition method with use of a deposition gas containing silicon fluoride and oxygen; processing the oxide semiconductor film and the first gate insulating film into an island-shaped oxide semiconductor film and an island-shaped first gate insulating film; forming a second gate insulating film by a plasma chemical vapor deposition method with use of a deposition gas containing silicon hydride and oxygen over the insulating film, the source electrode layer, the drain electrode layer, the island-shaped oxide semiconductor film, and the island-shaped first gate insulating film to cover the insulating film, the source electrode layer, the drain electrode layer, and the island-shaped first gate insulating film; and forming a gate electrode layer over the second gate insulating film overlapping with the oxide semiconductor film.

In any of the above structures, the first gate insulating film can be thin to have a thickness about greater than or equal to 1 nm and less than or equal to 10 nm, and the second gate insulating film stacked thereover can be thick to have a thickness about greater than or equal to 50 nm and less than or equal to 100 nm.

In the first gate insulating film formed using a deposition gas containing silicon fluoride and oxygen, a hydrogen concentration is lower than a fluorine concentration, for example, the fluorine concentration is greater than or equal to $1 \times 10^{20}$ atoms/cm$^3$, and the hydrogen concentration is less than $1 \times 10^{20}$ atoms/cm$^3$.

In the second gate insulating film formed using deposition gas containing silicon hydride and oxygen, a hydrogen concentration is higher than a fluorine concentration, for example, the fluorine concentration is less than $1 \times 10^{20}$ atoms/cm$^3$, and the hydrogen concentration is greater than or equal to $1 \times 10^{20}$ atoms/cm$^3$.

In the above structure, the insulating film and the first gate insulating film which are in contact with the oxide semiconductor film can be formed using a deposition gas containing silicon fluoride and dinitrogen monoxide by a plasma CVD method. Further, the second gate insulating film can be formed using the deposition gas containing silicon fluoride and dinitrogen monoxide by a plasma CVD method.

The first gate insulating film can be made a dense film when the first gate insulating film is formed by a plasma CVD method with use of a deposition gas containing silicon fluoride and oxygen. The dense first gate insulating film can prevent hydrogen contained in the second gate insulating film which is stacked over the first gate insulating film from entering the oxide semiconductor film.

On the other hand, the second gate insulating film formed over and in contact with the source electrode layer, the drain electrode layer, and the first gate insulating film is formed by a plasma CVD method with use of a deposition gas containing silicon hydride and oxygen, the second gate insulating film can be formed at relatively high deposition rate and thus made thicker than the first gate insulating film, which is advantageous in productivity. Further, the deposition gas does not contain fluorine, chlorine, and the like which corrode the source electrode layer and the drain electrode layer which are in contact with the second gate insulating film; thus, the second gate insulating film can be formed without roughening surfaces of the source electrode layer and the drain electrode layer.

The first gate insulating film is formed over the oxide semiconductor film in a state where the oxide semiconductor film covers the source electrode layer and the drain electrode layer. Therefore, the source electrode layer and the drain electrode layer are not exposed to the deposition gas containing silicon fluoride and oxygen which is used in the formation of the first gate insulating film and thus damage like corrosion does not occur.

Therefore, in the manufacturing process of a semiconductor device, a defective shape due to corrosion of the source electrode layer and the drain electrode layer, poor coverage of the second gate insulating film stacked thereover, or the like can be prevented, leading to manufacturing a highly reliable semiconductor device in a high yield.

A dense silicon oxide film which has a low hydrogen concentration and contains fluorine is formed with use of a deposition gas containing silicon fluoride and oxygen; over the dense silicon oxide film containing fluorine, a silicon oxide film having a higher deposition rate than the dense silicon oxide film is formed with use of a deposition gas containing silicon hydride and oxygen; and the formed films are used as gate insulating films; whereby the transistor can have stable electric characteristics and high reliability.

A semiconductor device can be manufactured in a high yield when the silicon oxide film formed with use of the deposition gas containing silicon hydride and oxygen, which is advantageous in productivity.

BEST MODE FOR CARRYING OUT THE INVENTION

Hereinafter, embodiments of the present invention disclosed in this specification will be described in detail with reference to the drawings. Note that the invention disclosed in this specification is not limited to the following description, and it is easily understood by those skilled in the art that modes and details can be variously changed. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an embodiment of a semiconductor device and a manufacturing method thereof will be described with reference to FIGS. 1A to 1C, FIGS. 2A to 2F, and FIGS. 3A and 3B. In this embodiment, a transistor including an oxide semiconductor film is described as an example of the semiconductor device.

Figure 1A:
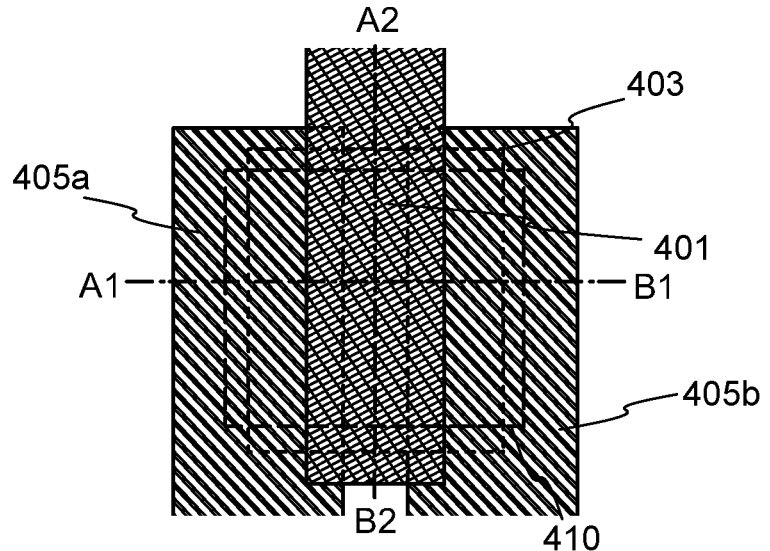
FIGS. 1A to 1C illustrate one embodiment of a semiconductor device.
Figure 1B:
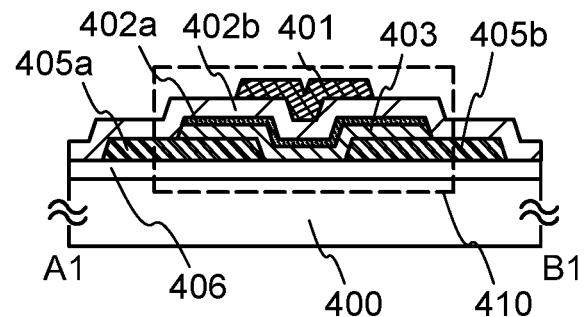
Figure 1C:
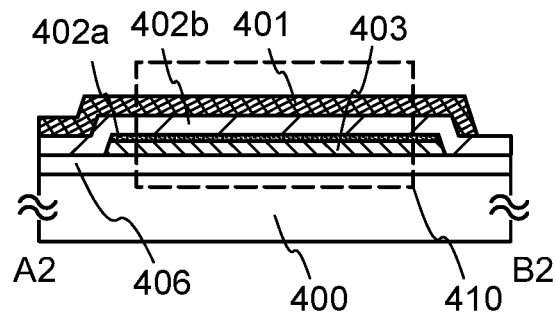

In FIGS. 1A to 1C, a plan view and cross-sectional views of top-gate staggered transistors (also referred to as forward-staggered transistors) are illustrated as examples of semiconductor devices. FIG. 1A is a plan view, FIG. 1B is a cross-sectional view along A1-B1 of FIG. 1A, and FIG. 1C is a cross-sectional view along A2-B2 of FIG. 1A. Note that a first gate insulating film 402a and a second gate insulating film 402b are omitted in FIG. 1A.

A transistor 410 illustrated in FIGS. 1A to 1C includes, over a substrate 400 having an insulating surface, an insulating film 406, a source electrode layer 405a, a drain electrode layer 405b, an oxide semiconductor film 403, a first gate insulating film 402a, a second gate insulating film 402b, and a gate electrode layer 401.

An insulator may further be formed over the transistor 410. An opening may be formed in the second gate insulating film 402b or the like in order that the source electrode layer 405a or the drain electrode layer 405b is electrically connected to a wiring. A second gate electrode may further be provided under the oxide semiconductor film 403 and the insulating film 406.

In the transistor 410, as the first gate insulating film 402a in contact with the oxide semiconductor film 403, a silicon oxide film is formed by a plasma CVD method using a deposition gas containing silicon fluoride and oxygen, and as the second gate insulating film 402b stacked over the first gate insulating film 402a, a silicon oxide film is formed by a plasma CVD method using a deposition gas containing silicon hydride and oxygen.

FIGS. 2A to 2F illustrate an example of a manufacturing method of the transistor 410.

First, the insulating film 406 functioning as a base film is formed over the substrate 400 having an insulating surface.

The insulating film 406 functioning as a base film has a function of preventing an impurity element from dispersing from the substrate 400, and can be formed by a plasma CVD method, a sputtering method, or the like. The insulating film 406 can have a single layer structure or a stacked structure using silicon oxide, silicon nitride, silicon oxynitride, silicon nitride oxide, aluminum oxide, aluminum nitride, aluminum oxynitride, aluminum nitride oxide, hafnium oxide, gallium oxide, or a combination thereof.

Since the insulating film 406 is in contact with the oxide semiconductor film 403, a silicon oxide film may be formed as the insulating film 406 by a plasma CVD method using a deposition gas which contains silicon fluoride and oxygen and does not contain hydrogen. As the silicon fluoride, silicon tetrafluoride ($SiF_4$), disilicon hexafluoride ($Si_2F_6$), or the like can be used. The deposition gas for the insulating film 406 may contain a rare gas (e.g., helium or argon).

The insulating film 406 formed by a plasma CVD method using a deposition gas containing silicon fluoride and oxygen can reduce the concentration of hydrogen which enters the oxide semiconductor film 403 to vary the transistor characteristics, because the deposition gas does not contain hydrogen. Thus, when the insulating film 406 is formed to be in contact with the oxide semiconductor film 403, the oxide semiconductor film 403 is not contaminated with hydrogen, and an impurity such as hydrogen can be prevented from entering the oxide semiconductor film 403 from another film.

For forming an insulating film included in a semiconductor device, a high-density plasma CVD using microwaves (e.g., with a frequency of 2.45 GHz) is preferably employed because a high-quality insulating film which is dense and has high withstand voltage can be formed.

There is no particular limitation on a substrate that can be used as the substrate 400 having an insulating surface as long as it has at least heat resistance to withstand heat treatment performed later. For example, a glass substrate such as a barium borosilicate glass substrate or an aluminoborosilicate glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Still alternatively, any of these substrates provided with a semiconductor element may be used as the substrate 400.

Alternatively, a flexible substrate may be used as the substrate 400. In the case of using a flexible substrate, a transistor including an oxide semiconductor film may be directly formed over the flexible substrate, or a transistor including an oxide semiconductor film may be formed over a different formation substrate and then separated to be transferred to the flexible substrate. Note that, in order to separate the transistor from the formation substrate and transfer it to the flexible substrate, a separation layer may be provided between the formation substrate and the transistor including an oxide semiconductor film.

Next, a conductive film to be the source electrode layer 405a and the drain electrode layer 405b (including a wiring formed of the same layer) is formed over the insulating film 406. As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, or W, or a metal nitride film of any of these elements (a titanium nitride film, a molybdenum nitride film, and a tungsten nitride film) may be stacked on one or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

Figure 2A:
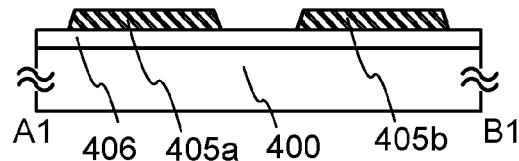
FIGS. 2A to 2F illustrate one embodiment of a manufacturing method of a semiconductor device.
Figure 2B:
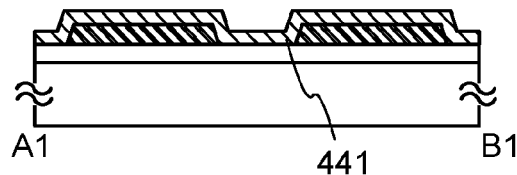

Through a first photolithography process, a resist mask is formed over the conductive film, selective etching is performed so that the source electrode layer 405a and the drain electrode layer 405b are formed, and then, the resist mask is removed (see FIG. 2A).

Note that the resist mask may be formed by an inkjet method. Formation of the resist mask by an inkjet method needs no photomask; thus, manufacturing cost can be reduced.

In order that the oxide semiconductor film formed over the insulating film 406, the source electrode layer 405a, and the drain electrode layer 405b contains as little hydrogen, a hydroxyl group, and moisture as possible, it is preferable that an impurity adsorbed on the substrate 400, such as hydrogen or moisture, be eliminated and removed by pre-heating the substrate 400, on which the process up to and including the step of forming the insulating film 406 or the step of forming the source electrode layer 405a and the drain electrode layer 405b is already performed in a preheating chamber of a sputtering apparatus, as pretreatment for formation of the oxide semiconductor film. As an exhaustion unit provided in the preheating chamber, a cryopump is preferable. Note that this preheating treatment can be omitted.

Next, over the insulating film 406, the source electrode layer 405a, and the drain electrode layer 405b, an oxide semiconductor film with a thickness greater than or equal to 2 nm and less than or equal to 200 nm, preferably greater than or equal to 5 nm and less than or equal to 30 nm is formed.

An oxide semiconductor used for the oxide semiconductor film contains at least one kind of an element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material, or a single-component metal oxide such as an In—O-based oxide semiconductor, a Sn—O-based oxide semiconductor, or a Zn—O-based oxide semiconductor can be used. In addition, the oxide semiconductor may contain an element other than In, Ga, Sn, and Zn, for example, $SiO_2$.

For example, an In—Ga—Zn—O-based semiconductor means an oxide semiconductor containing indium (In), gallium (Ga), and zinc (Zn), and there is no limitation on the composition ratio thereof.

For the oxide semiconductor film, a thin film expressed by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

As an oxide semiconductor used for the oxide semiconductor film, an oxide semiconductor containing indium, an oxide semiconductor containing indium and gallium, or the like is preferably used.

In this embodiment, the oxide semiconductor film is formed by a sputtering method with use of an In—Ga—Zn—O-based oxide semiconductor target. The oxide semiconductor film can be formed by a sputtering method under a rare gas (typically, argon) atmosphere, an oxygen atmosphere, or a mixed atmosphere containing a rare gas and oxygen.

In the case of using an In—Zn—O-based material as an oxide semiconductor, a target has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the oxide target is higher than or equal to 90% and lower than or equal to 100%, preferably higher than or equal to 95% and lower than or equal to 99.9%. With use of the metal oxide target with high filling rate, a dense oxide semiconductor film can be formed.

As a sputtering gas used for forming the oxide semiconductor film, it is preferable to use a high-purity gas from which an impurity such as hydrogen, water, a hydroxyl group, or hydride is removed.

The substrate is held in a deposition chamber kept under reduced pressure, and the substrate temperature is set to higher than or equal to 100° C. and lower than or equal to 600° C., preferably higher than or equal to 200° C. and lower than or equal to 400° C. By forming the oxide semiconductor film in a state where the substrate is heated, the concentration of an impurity included in the formed oxide semiconductor film can be reduced. In addition, damage by sputtering can be reduced. Then, residual moisture in the deposition chamber is removed, a sputtering gas from which hydrogen and moisture are removed is introduced, and the above-described target is used, so that the oxide semiconductor film is formed over the substrate 400. In order to remove residual moisture in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with a cryopump, for example, a hydrogen atom, a compound containing a hydrogen atom, such as water (further preferably, also a compound containing a carbon atom), and the like are removed, whereby the concentration of an impurity included in the oxide semiconductor film formed in the deposition chamber can be reduced.

As an example of the deposition conditions, the following conditions are employed: the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). When a pulsed direct-current power source is used, powder substances (also referred to as particles or dust) that are generated in deposition can be reduced and the film thickness can be uniform, which is preferable.

Next, the oxide semiconductor film is subjected to heat treatment. Through the heat treatment, excessive hydrogen (including water and a hydroxyl group) in the oxide semiconductor film is removed (dehydrated or dehydrogenated) and the structure of the oxide semiconductor film is modified, so that defect levels in an energy gap can be reduced. The temperature of the heat treatment is higher than or equal to 250° C. and lower than or equal to 750° C., or higher than or equal to 400° C. and lower than the strain point of the substrate. Here, the substrate is put in an electric furnace which is one of heat treatment apparatuses and the oxide semiconductor film is subjected to heat treatment at 450° C. for one hour under a nitrogen atmosphere, and then water or hydrogen is prevented from entering the oxide semiconductor film by preventing the substrate from being exposed to the atmosphere; thus, an oxide semiconductor film 441 is obtained (see FIG. 2B).

A heat treatment apparatus is not limited to an electric furnace, and a device for heating an object to be processed by heat conduction or heat radiation from a heating element such as a resistance heating element may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas which does not react with an object to be processed by heat treatment, such as a nitrogen gas or a rare gas like argon, is used.

For example, as the heat treatment, GRTA in which the substrate is moved into an inert gas heated to a high temperature higher than or equal to 650° C. and lower than or equal to 700° C., heated for several minutes, and moved out of the inert gas heated to the high temperature may be performed.

Note that it is preferable that in the heat treatment, water, hydrogen, or the like be not contained in nitrogen or a rare gas such as helium, neon, or argon. The purity of nitrogen or the rare gas such as helium, neon, or argon which is introduced into the heat treatment apparatus is preferably higher than or equal to 6N (99.9999%), further preferably higher than or equal to 7N (99.99999%) (that is, the impurity concentration is preferably lower than or equal to 1 ppm, further preferably lower than or equal to 0.1 ppm).

In addition, after the oxide semiconductor film is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step for removing impurities by dehydration or dehydrogenation is supplied, so that the oxide semiconductor film can be a high-purity and electrically i-type (intrinsic) oxide semiconductor film.

The heat treatment can be performed on the oxide semiconductor film after being processed into an island-shaped oxide semiconductor film. The heat treatment may be performed on the island-shaped oxide semiconductor film over which a first gate insulating film and/or a second gate insulating film are/is formed as long as the oxide semiconductor film is formed before that heat treatment.

Oxygen doping treatment may be performed on the oxide semiconductor film 441 which has been dehydrated or dehydrogenated. By the oxygen doping treatment on the oxide semiconductor film 441, oxygen is supplied to the oxide semiconductor film 441, whereby oxygen can be contained in the oxide semiconductor film 441 or in the oxide semiconductor film 441 and the vicinity of the interface.

Note that the oxygen doping treatment is addition of an oxygen radical, an oxygen atom, or an oxygen ion to a surface and the bulk of the oxide semiconductor film. In particular, addition of an oxygen radical, an oxygen atom, or an oxygen ion to the surface and the bulk of the oxide semiconductor film, with oxygen plasma is also called oxygen plasma doping treatment. The substrate over which the oxide semiconductor film is formed is preferably biased.

By the oxygen doping treatment in the manufacturing process of the transistor including the oxide semiconductor film disclosed in this specification, an oxygen-excessive region where the amount of oxygen is greater than the stoichiometric proportion can be provided in at least one of the insulating film (bulk thereof), the oxide semiconductor film (bulk thereof), the gate insulating film (bulk thereof), an interface between the gate insulating film and the oxide semiconductor film, and an interface between the oxide semiconductor film and the insulating film.

The above-described oxygen-excessive region may be provided in two or more of the insulating film, the oxide semiconductor film, and the gate insulating film. For example, oxygen-excessive regions can be provided in the interface between the gate insulating film and the oxide semiconductor film, the oxide semiconductor film (bulk thereof), and the interface between the oxide semiconductor film and the insulating film by oxygen doping treatment in the manufacturing process.

Oxygen for the doping (an oxygen radical, an oxygen atom, and/or an oxygen ion) may be supplied from a plasma generating apparatus with use of a gas containing oxygen or from an ozone generating apparatus. More specifically, for example, oxygen is generated with a device used in a manufacturing process of a semiconductor device, such as a device for etching treatment on a semiconductor device or a device for ashing on a resist mask, so that the treatment can be performed on the oxide semiconductor film 441.

In addition, heat treatment (at temperature higher than or equal to 150° C. and lower than or equal to 470° C.) may be performed on the oxide semiconductor film 441 which has been subjected to the oxygen doping treatment. The heat treatment may be performed under an atmosphere of nitrogen, oxygen, an ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas is preferably highly purified without containing water, hydrogen, or the like.

Through the above steps, the oxide semiconductor film 441 which is highly purified and is made electrically i-type (intrinsic) is obtained. The number of carriers in the highly purified oxide semiconductor film 441 is significantly small (close to zero).

Figure 2C:
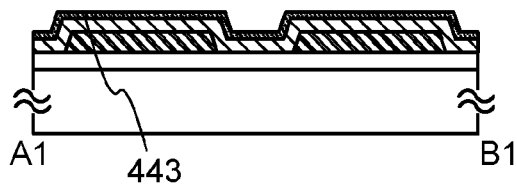

Next, a first gate insulating film 443 is formed over the oxide semiconductor film 441 (see FIG. 2C). As the first gate insulating film 443, a silicon oxide film is formed by a plasma CVD method with use of a deposition gas which contains silicon fluoride and oxygen and does not contain hydrogen. As silicon fluoride, silicon tetrafluoride ($SiF_4$), disilicon hexafluoride ($Si_2F_6$), or the like can be used. The deposition gas for the first gate insulating film 443 may contain a rare gas (e.g., helium or argon).

The first gate insulating film 443 formed by a plasma CVD method using a deposition gas containing silicon fluoride and oxygen can reduce the concentration of hydrogen which enters the oxide semiconductor film 403 to vary the transistor characteristics, because the deposition gas does not contain hydrogen. Thus, when the first gate insulating film 443 is formed to be in contact with the oxide semiconductor film 403, the oxide semiconductor film 403 is not contaminated with hydrogen, and entry of an impurity such as hydrogen from another film to the oxide semiconductor film 403 can be prevented.

In this embodiment, the first gate insulating film 443 is formed by a plasma CVD method with use of a deposition gas containing silicon tetrafluoride ($SiF_4$), dinitrogen monoxide ($N_2O$), and argon (Ar). For example, the conditions for forming the first gate insulating film 443 may be as follows: silicon tetrafluoride ($SiF_4$), dinitrogen monoxide ($N_2O$), and argon (Ar) ($SiF_4$: $N_2O$:Ar=6 sccm:1000 sccm: 1000 sccm) are used for the deposition gas, the pressure in a chamber is 133 Pa, the power is 800 W, the power supply frequency is 60 MHz, and the substrate (silicon wafer) temperature is 400° C.

Thus, the first gate insulating film 443 is a silicon oxide film containing fluorine. In the first gate insulating film 443 formed with use of a deposition gas containing silicon fluoride and oxygen, the hydrogen concentration is lower than the fluorine concentration. It is preferable that the fluorine concentration be $1 \times 10^{20}$ atoms/$cm^3$ or higher and the hydrogen concentration be lower than $1 \times 10^{20}$ atoms/$cm^3$. The thickness of the first gate insulating film 443 may be about greater than or equal to 1 nm and less than or equal to 10 nm.

The first gate insulating film 443 is formed over the oxide semiconductor film 441 in a state where the oxide semiconductor film 441 covers the source electrode layer 405a and the drain electrode layer 405b. Therefore, the source electrode layer 405a and the drain electrode layer 405b are not exposed to the deposition gas containing silicon fluoride and oxygen which is used in the formation of the first gate insulating film 443 and thus damage like corrosion does not occur.

Figure 2D:
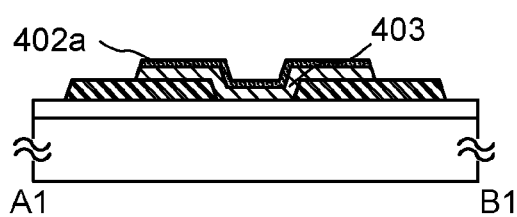

Next, through a second photolithography process, the oxide semiconductor film 441 and the first gate insulating film 443 are processed into the island-shaped oxide semiconductor film 403 and the island-shaped first gate insulating film 402a (see FIG. 2D). A resist mask which is used in the formation of the island-shaped oxide semiconductor film 441 and the island-shaped first gate insulating film 402a may be formed by an ink-jet method. Formation of the resist mask by an inkjet method needs no photomask; thus, manufacturing cost can be reduced.

Note that the etching of the oxide semiconductor film may be dry etching, wet etching, or both dry etching and wet etching. For example, the first gate insulating film 443 may be processed by dry etching and the oxide semiconductor film 441 may be processed by wet etching with use of the first gate insulating film 402a as a mask. As an etching gas for dry etching of the first gate insulating film 443, a gas containing chlorine (a chlorine-based gas such as chlorine ($Cl_2$), boron trichloride ($BCl_3$), silicon tetrachloride ($SiCl_4$), or carbon tetrachloride ($CCl_4$)) or a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), or the like can be used. Alternatively, a gas obtained by adding oxygen or a rare gas (such as Ar) to the above gas may be used as the etching gas. As an etchant used for wet etching of the oxide semiconductor film, a mixed solution of phosphoric acid, acetic acid, and nitric acid, or the like can be used. For example, ITO07N (produced by KANTO CHEMICAL CO., INC.) may be used.

When the oxide semiconductor film 441 and the first gate insulating film 443 are etched with use of the same mask, the island-shaped oxide semiconductor film 403 and the island-shaped first gate insulating film 402a can be formed to have the same shape, whereby end portions of the oxide semiconductor film 403 and the first gate insulating film 402a can be aligned as in FIG. 2D.

Figure 2E:
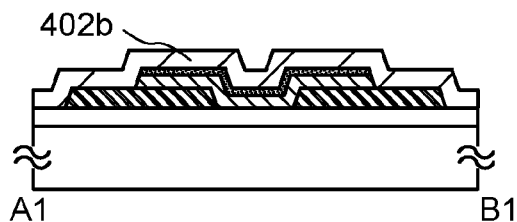

Next, the second gate insulating film 402b is formed over the insulating film 406, the source electrode layer 405a, the drain electrode layer 405b, the oxide semiconductor film 403, and the first gate insulating film 402a (see FIG. 2E). As the second gate insulating film 402b, a silicon oxide film is formed by a plasma CVD method with use of a deposition gas containing silicon hydride and oxygen. As silicon hydride, silicon tetrahydride (monosilane: $SiH_4$), silicon hexahydride (disilane: $Si_2H_6$), silicon octahydride (trisilane: $Si_3H_8$), or the like can be used. The deposition gas for the second gate insulating film 402b may contain a rare gas (e.g., helium or argon).

In this embodiment, the second gate insulating film 402b is formed by a plasma CVD method with use of a deposition gas containing silicon hydride ($SiH_4$) and dinitrogen monoxide ($N_2O$). For example, the conditions for forming the second gate insulating film 402b may be as follows: silicon tetrahydride ($SiH_4$) and dinitrogen monoxide ($N_2O$) ($SiH_4$: $N_2O$=4 sccm:800 sccm) are used for a deposition gas, the pressure in a chamber is 40 Pa, the power is 150 W, the power supply frequency is 60 MHz, and the substrate (silicon wafer) temperature is 400° C.

Thus, the second gate insulating film 402b is a silicon oxide film having higher hydrogen concentration than the first gate insulating film 402a. In the second gate insulating film 402b formed with use of a deposition gas containing silicon hydride and oxygen, the hydrogen concentration is higher than the fluorine concentration. It is preferable that the fluorine concentration be lower than $1 \times 10^{20}$ atoms/$cm^3$ and the hydrogen concentration be $1 \times 10^{20}$ atoms/$cm^3$ or higher. The thickness of the second gate insulating film 402b may be about greater than or equal to 50 nm and less than or equal to 100 nm.

The first gate insulating film 402a can be made a dense film when the first gate insulating film 402a is formed by a plasma CVD method with use of a deposition gas containing silicon fluoride and oxygen. The dense first gate insulating film 402a can prevent hydrogen contained in the second gate insulating film 402b which is stacked over the first gate insulating film 402a from entering the oxide semiconductor film.

Since the second gate insulating film 402b formed over and in contact with the source electrode layer 405a, the drain electrode layer 405b, and the first gate insulating film 402a is formed by a plasma CVD method with use of a deposition gas containing silicon hydride and oxygen, the second gate insulating film 402b can be formed at relatively high deposition rate and thus made thicker than the first gate insulating film 402a, which is advantageous in productivity. Further, the deposition gas does not contain fluorine, chlorine, and the like which corrode the source electrode layer 405a and the drain electrode layer 405b which are in contact with the second gate insulating film 402b; thus, the second gate insulating film 402b can be formed without roughening surfaces of the source electrode layer 405a and the drain electrode layer 405b.

Therefore, in the manufacturing process of a semiconductor device, a defective shape due to corrosion of the source electrode layer 405a and the drain electrode layer 405b, poor coverage of the second gate insulating film 402b stacked thereover, or the like can be prevented, leading to manufacturing a highly reliable semiconductor device in a high yield.

Next, a conductive film is formed over the second gate insulating film 402b, and then the gate electrode layer 401 is formed through a third photolithography process.

The gate electrode layer 401 can be formed by a plasma CVD method, a sputtering method, or the like. The gate electrode layer 401 can have a single layer structure or a stacked structure using a metal material such as molybdenum, titanium, tantalum, tungsten, aluminum, copper, neodymium, or scandium, or an alloy containing any of these materials as its main component.

Figure 2F:
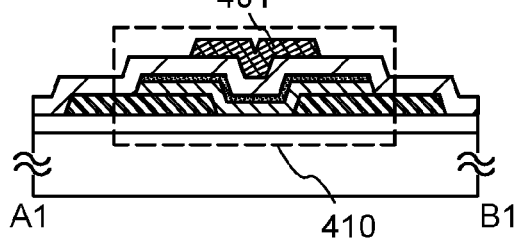

Through the above steps, the transistor 410 is formed (see FIG. 2F). The oxide semiconductor film 403 is highly purified by removing impurities which cause variation in the transistor characteristics such as hydrogen, moisture, a hydroxyl group, and hydride (also referred to as a hydrogen compound) from the oxide semiconductor film. The transistor 410 includes the oxide semiconductor film 403 and thus the hydrogen concentration of the first gate insulating film 402a in contact with the oxide semiconductor film 403 is suppressed to be low. Therefore, variation in the electric characteristics of the transistor 410 is suppressed and the transistor 410 is electrically stable.

Figure 3A:
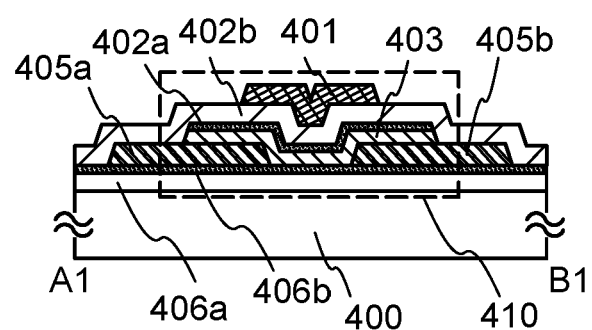
FIGS. 3A and 3B each illustrate one embodiment of a semiconductor device.

As in FIG. 3A, the insulating film 406 may have a stacked structure of a first insulating film 406a and a second insulating film 406b. As the second insulating film 406b which is in contact with the oxide semiconductor film 403, a silicon oxide film may be formed, in a manner similar to that of the first gate insulating film 402a, by a plasma CVD method with use of a deposition gas which contains silicon fluoride and oxygen and does not contain hydrogen. In that case, as the first insulating film 406a, a dense nitride film such as a silicon nitride film or a silicon nitride oxide film may be used so that entry of an impurity from the substrate 400 is prevented.

Figure 3B:
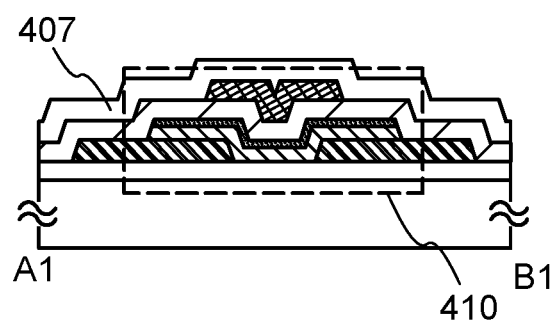

Alternatively, as illustrated in FIG. 3B, an insulating film 407 may be formed over the gate electrode layer 401 as a protective film covering the transistor 410.

The insulating film 407 can be formed by a plasma CVD method, a sputtering method, or the like. The insulating film 407 can have a single layer structure or a stacked structure using silicon oxide, silicon nitride, silicon oxynitride, silicon nitride oxide, aluminum oxide, aluminum nitride, aluminum oxynitride, aluminum nitride oxide, hafnium oxide, gallium oxide, or a combination thereof.

Heat treatment may be performed after the formation of the insulating film 407. The heat treatment is performed at a temperature higher than or equal to 250° C. and lower than or equal to 700° C., preferably higher than or equal to 450° C. and lower than or equal to 600° C. or lower than a strain point of the substrate.

The heat treatment may be performed under an atmosphere of nitrogen, oxygen, an ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system), or a rare gas (argon, helium, or the like). The atmosphere of nitrogen, oxygen, the ultra dry air, or the rare gas preferably contains water, hydrogen, or the like as less as possible. The purity of nitrogen, oxygen, or the rare gas which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In the transistor 410 including the highly-purified oxide semiconductor film 403 according to this embodiment, the current in an off state (the off-state current) can be small.

Further, in the transistor 410 including the oxide semiconductor film 403, relatively high field-effect mobility can be obtained, which enables high-speed operation. Consequently, with the above transistor provided in a pixel portion of a semiconductor device having a display function, high-quality images can be displayed. In addition, by using the transistor including the highly purified oxide semiconductor film, a driver circuit portion and a pixel portion can be formed over one substrate, whereby the number of components of the semiconductor device can be reduced.

In this manner, a semiconductor device including an oxide semiconductor, which has stable electric characteristics, can be provided. Accordingly, a semiconductor device with high reliability can be provided.

Embodiment 2

A semiconductor device having a display function (also referred to as a display device) can be manufactured using the transistor whose example is described in Embodiment 1. Moreover, part or all of driver circuitry which includes the transistor can be formed over a substrate where a pixel portion is formed, whereby a system-on-panel can be obtained.

Figure 10A:
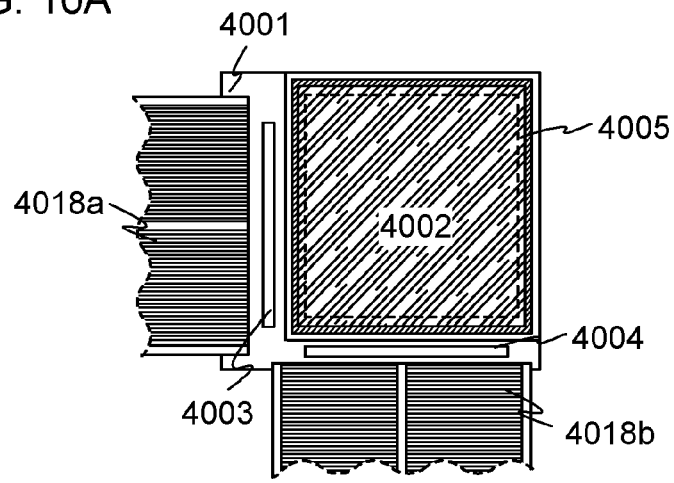
FIGS. 10A to 10C each illustrate one embodiment of a semiconductor device.

In FIG. 10A, a sealant 4005 is provided so as to surround a pixel portion 4002 provided over a first substrate 4001, and the pixel portion 4002 is sealed with a second substrate 4006. In FIG. 10A, a signal line driver circuit 4003 and a scan line driver circuit 4004 which are formed using a single crystal semiconductor film or a polycrystalline semiconductor film over another substrate are mounted in a region that is different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018a and 4018b.

Figure 10B:
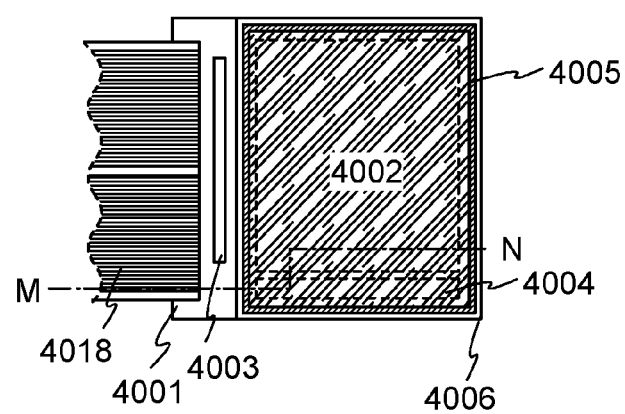
Figure 10C:
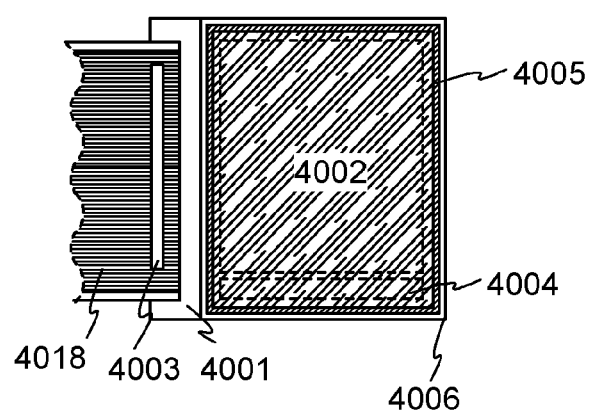

In FIGS. 10B and 10C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 are sealed together with the display element, by the first substrate 4001, the sealant 4005, and the second substrate 4006. In FIGS. 10B and 10C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 10B and 10C, various signals and potentials are supplied to the signal line driver circuit 4003, the scan line driver circuit 4004, and the pixel portion 4002 from an FPC 4018.

Although FIGS. 10B and 10C each illustrate an example in which the signal line driver circuit 4003 is separately formed and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

A connection method of a separately formed driver circuit is not particularly limited; a chip on glass (COG) method, a wire bonding method, a tape automated bonding (TAB)

method, or the like can be used. FIG. 10A illustrates an example in which the signal line driver circuit 4003 and the scan line driver circuit 4004 are mounted by a COG method. FIG. 10B illustrates an example in which the signal line driver circuit 4003 is mounted by a COG method. FIG. 10C illustrates an example in which the signal line driver circuit 4003 is mounted by a TAB method.

In addition, the display device includes a panel in which the display element is sealed, and a module in which an IC or the like including a controller is mounted on the panel.

Note that the display device in this specification means an image display device, a display device, or a light source (including a lighting device). Furthermore, the display device also includes the following in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors; any of the transistors which are described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 4:
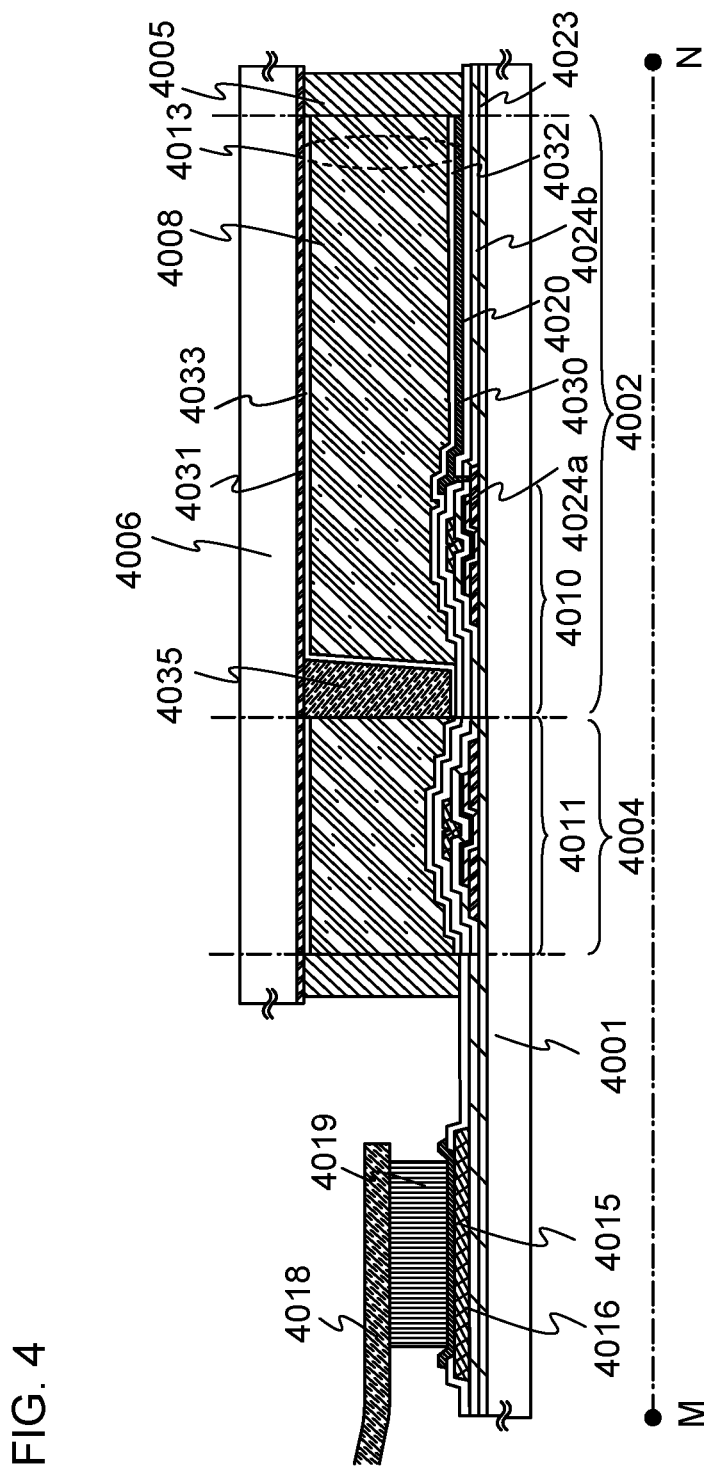
FIG. 4 illustrates one embodiment of a semiconductor device.
Figure 5:
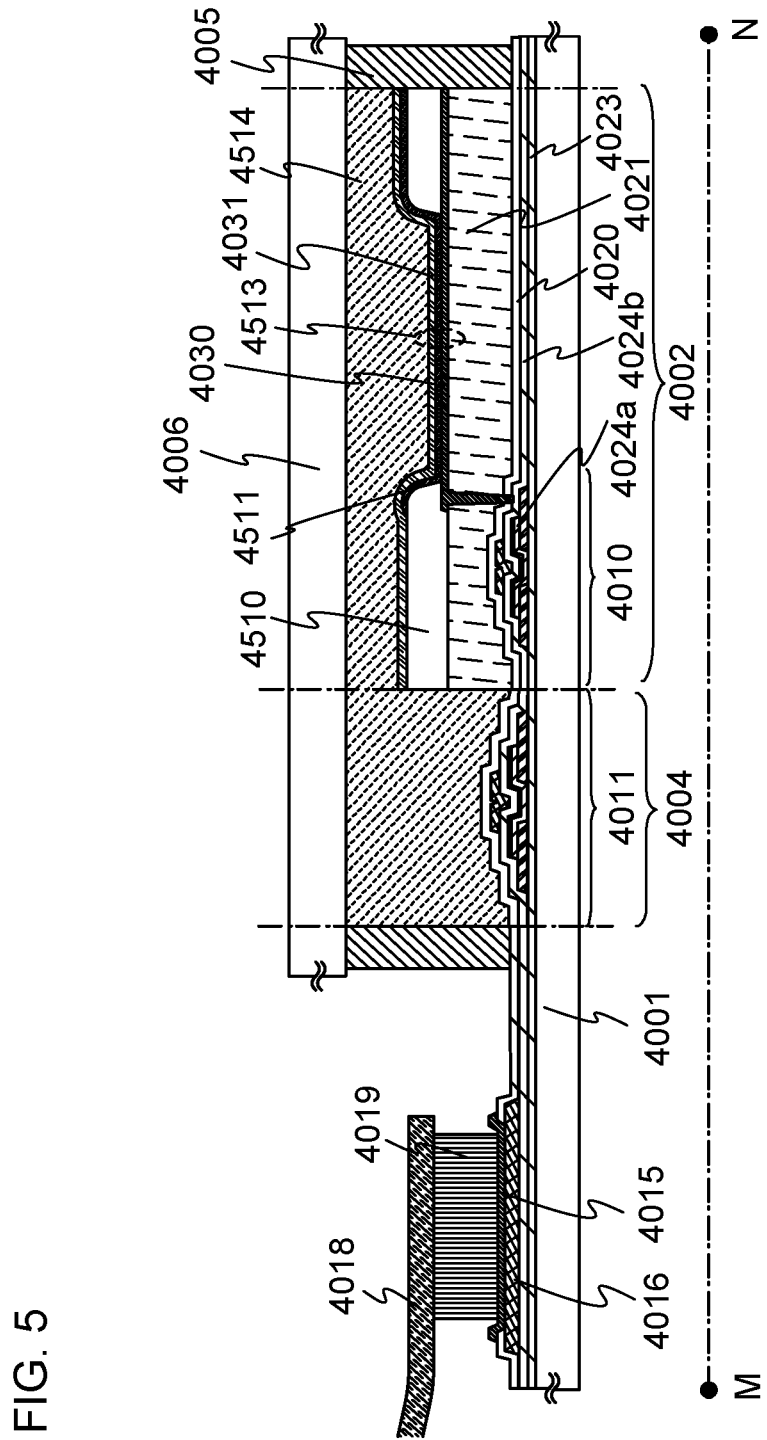
FIG. 5 illustrates one embodiment of a semiconductor device.
Figure 6:
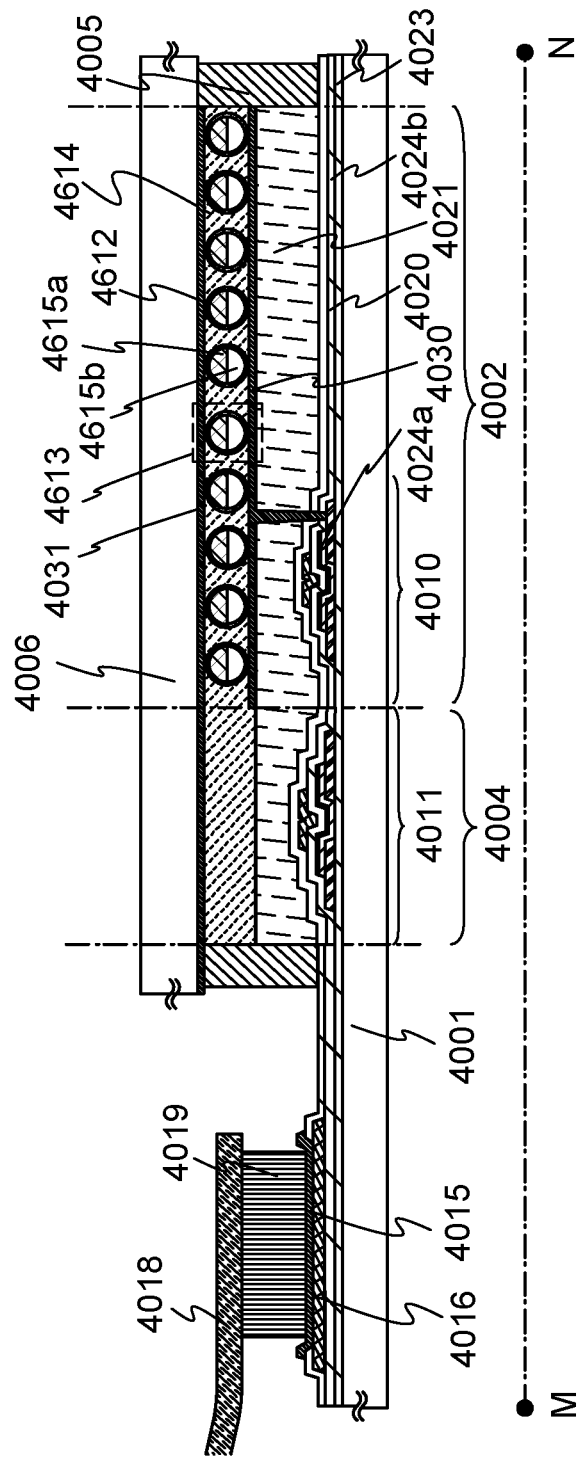
FIG. 6 illustrates one embodiment of a semiconductor device.

One embodiment of the semiconductor device is described with reference to FIGS. 4 to 6. FIGS. 4 to 6 correspond to cross-sectional views along line M-N in FIG. 10B.

As illustrated in FIGS. 4 to 6, the semiconductor device includes a connection terminal electrode 4015 and a terminal electrode 4016. The connection terminal electrode 4015 and the terminal electrode 4016 are electrically connected to a terminal included in the FPC 4018 via an anisotropic conductive film 4019.

The connection terminal electrode 4015 is formed using the same conductive film as a first electrode layer 4030, and the terminal electrode 4016 is formed using the same conductive film as source and drain electrodes of a transistor 4010 and a transistor 4011.

The pixel portion 4002 and the scan line driver circuit 4004 which are provided over the first substrate 4001 include a plurality of transistors. In FIGS. 4 to 6, the transistor 4010 included in the pixel portion 4002 and the transistor 4011 included in the scan line driver circuit 4004 are illustrated as an example. In FIG. 4, an insulating film 4020 is provided over the transistor 4010 and the transistor 4011. In FIGS. 5 and 6, an insulating layer 4021 is further provided. An insulating film 4023 is an insulating film functioning as a base film.

In this embodiment, any of the transistors described in Embodiment 1 can be applied to the transistor 4010 and the transistor 4011. Variation in electric characteristics of the transistor 4010 and the transistor 4011 is suppressed and the transistor 4010 and the transistor 4011 are electrically stable. Accordingly, highly reliable semiconductor devices can be provided as the semiconductor devices illustrated in FIGS. 4 to 6.

The transistor 4010 provided in the pixel portion 4002 is electrically connected to the display element in a display panel. A variety of display elements can be used as the display element as long as display can be performed.

An example of a liquid crystal display device using a liquid crystal element as the display element is illustrated in FIG. 4. In FIG. 4, a liquid crystal element 4013 which is a display element includes the first electrode layer 4030, the second electrode layer 4031, and a liquid crystal layer 4008. An insulating film 4032 and an insulating film 4033 which serve as alignment films are provided so that the liquid crystal layer 4008 is provided therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer obtained by selective etching of an insulating film and is provided in order to control the thickness (a cell gap) of the liquid crystal layer 4008. Note that the spacer is not limited to a columnar spacer, and, for example, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 weight percent or more of a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1\times10^9$ $\Omega\cdot$cm or more, preferably $1\times10^{11}$ $\Omega\cdot$cm or more, further preferably $1\times10^{12}$ $\Omega\cdot$cm or more. The value of the specific resistivity in this specification is measured at 20° C.

The size of a storage capacitor formed in the liquid crystal display device is set considering the leakage current of the transistor provided in the pixel portion, or the like so that electrical charge can be held for a predetermined period. By using the transistor including the highly purified oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electrical signal such as an image signal can be held for a long period, and a writing interval can be set long in a state where power is being supplied. Accordingly, the frequency of refresh operation can be reduced, which leads to an effect of suppressing power consumption.

In addition, the transistor including the highly purified oxide semiconductor film used in this embodiment can have relatively high field-effect mobility and thus is capable of high speed operation. Therefore, by using the transistor in the pixel portion of the liquid crystal display device, a high-quality image can be displayed. Moreover, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device employing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as the light source.

In addition, it is possible to employ a time-division display method (a field-sequential driving method) with the use of a plurality of light-emitting diodes (LEDs) as a backlight. A field-sequential driving method enables color display without using a color filter.

As a display method in the pixel portion, a progressive method, an interlace method or the like can be employed. Further, color elements controlled in a pixel for color display are not limited to three colors of R, G, and B (R, G, and B correspond to red, green, and blue, respectively). For example, the following can be used: R, G, B, and W (W corresponds to white); or R, G, B, and one or more of yellow, cyan, magenta, and the like. The sizes of display regions may be different between respective dots of the color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified depending on whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified depending on the element structure into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. An example using an organic EL element as a light-emitting element is described here.

In order to extract light emitted from the light-emitting element, at least one of a pair of electrodes is transparent. The transistor and the light-emitting element are provided over the substrate. The light-emitting element can have any of the following emission structures: a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side.

An example of a light-emitting device in which a light-emitting element is used as the display element is illustrated in FIG. 5. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 5. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that the sidewall of the opening has a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a diamond like carbon (DLC) film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate for a light-emitting surface of the light-emitting element. Further, the polarizing plate or the circularly polarizing plate may be provided with an anti-reflection film. For example, anti-glare treatment by which reflected light can be diffused by surface roughness so as to reduce the glare can be performed.

Further, an electronic paper in which electronic ink is driven can be provided as the display device. The electronic paper is also called an electrophoretic display device (electrophoretic display) and has advantages in that it exhibits the same level of readability as regular paper, it exhibits less power consumption than other display devices, and it can be in a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (one of which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles containing a pigment, color display can also be achieved.

The first particles and the second particles in the microcapsules may be formed of one kind of material selected from a conductive material, an insulating material, a semiconductor material, a magnetic material, a liquid crystal material, a ferroelectric material, an electroluminescent material, an electrochromic material, and a magnetophoretic material, or a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 6 illustrates active matrix electronic paper as one embodiment of a semiconductor device. The electronic paper illustrated in FIG. 6 is an example of a display device using the twisting ball display system. The twist ball display system refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a black region 4615*a*, a white region 4615*b*, and a cavity 4612 which is filled with liquid around the black region 4615*a* and the white region 4615*b*, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIGS. 4 to 6, a flexible substrate as well as a glass substrate can be used as any of the first substrate 4001 and the second substrate 4006. For example, a plastic substrate having a light-transmitting property can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating film 4023 can be formed using an inorganic insulating material such as silicon oxide, silicon oxynitride, hafnium oxide, aluminum oxide, aluminum oxynitride, or gallium oxide.

As the insulating film 4023, in a manner similar to that of the first gate insulating film 4024*a*, a silicon oxide film is formed by a plasma CVD method with use of a deposition gas which contains silicon fluoride and oxygen and does not contain hydrogen. When the insulating film 4023 is formed by a plasma CVD method with use of a deposition gas containing silicon fluoride and oxygen, since the deposition gas does not contain hydrogen, the concentration of hydrogen which enters the oxide semiconductor film and causes variation in the transistor characteristics can be suppressed to be low.

The insulating film 4020 can be formed using a material including an inorganic insulating material such as silicon oxide, silicon oxynitride, hafnium oxide, aluminum oxide, gallium oxide, silicon nitride, silicon nitride oxide, aluminum nitride, aluminum oxynitride, or aluminum nitride oxide. The insulating film 4020 may have a single structure or a stacked structure and functions as a protective film of the transistor. There is no particular limitation on the manufacturing method of the insulating film 4020, for example, a plasma CVD method or a sputtering method can be employed.

As the first gate insulating film 4024*a*, a silicon oxide film may be formed by a plasma CVD method using a deposition gas which contains silicon fluoride and oxygen and does not contain hydrogen. As the silicon fluoride, silicon tetrafluoride ($SiF_4$), disilicon hexafluoride ($Si_2F_6$), or the like can be used. The deposition gas for the first gate insulating film 402*a* may contain a rare gas (e.g., helium or argon).

The first gate insulating film 4024*a* formed by a plasma CVD method using a deposition gas containing silicon fluoride and oxygen can reduce the concentration of hydrogen which enters the oxide semiconductor film to vary the transistor characteristics, because the deposition gas does not contain hydrogen. Thus, when the first gate insulating film 4024a is formed to be in contact with the oxide semiconductor film, the oxide semiconductor film is not contaminated with hydrogen, and an impurity such as hydrogen can be prevented from entering the oxide semiconductor film from another film.

The first gate insulating film 4024a is formed by a plasma CVD method with use of a deposition gas containing silicon tetrafluoride ($SiF_4$), dinitrogen monoxide ($N_2O$), and argon (Ar). For example, the conditions for forming the first gate insulating film 4024a may be as follows: silicon tetrafluoride ($SiF_4$), dinitrogen monoxide ($N_2O$), and argon (Ar) ($SiF_4$:$N_2O$: Ar=6 sccm:1000 sccm:1000 sccm) are used for the deposition gas, the pressure in a chamber is 133 Pa, the power is 800 W, the power supply frequency is 60 MHz, and the substrate (silicon wafer) temperature is 400° C.

Thus, the first gate insulating film 4024a is a silicon oxide film containing fluorine. In the first gate insulating film 4024a formed with use of a deposition gas containing silicon fluoride and oxygen, the hydrogen concentration is lower than the fluorine concentration. It is preferable that the fluorine concentration be $1\times10^{20}$ atoms/cm$^3$ or higher and the hydrogen concentration be lower than $1\times10^{20}$ atoms/cm$^3$. The thickness of the first gate insulating film 4024a may be about greater than or equal to 1 nm and less than or equal to 10 nm.

As described in Embodiment 1, the first gate insulating film 4024a is formed over the oxide semiconductor film in a state where the oxide semiconductor film covers the source electrode layer and the drain electrode layer. Therefore, the source electrode layer and the drain electrode layer are not exposed to the deposition gas containing silicon fluoride and oxygen which is used in the formation of the first gate insulating film 4024a and thus damage like corrosion does not occur.

As the second gate insulating film 4024b, a silicon oxide film is formed by a plasma CVD method with use of a deposition gas containing silicon hydride and oxygen.

As silicon hydride, silicon tetrahydride (monosilane: $SiH_4$), silicon hexahydride (disilane: $Si_2H_6$), silicon octahydride (trisilane: $Si_3H_8$), or the like can be used. The deposition gas for the second gate insulating film 4024b may contain a rare gas (e.g., helium or argon).

In this embodiment, the second gate insulating film 4024b is formed by a plasma CVD method with use of a deposition gas containing silicon hydride ($SiH_4$) and dinitrogen monoxide ($N_2O$). For example, the conditions for forming the second gate insulating film 4024b may be as follows: silicon tetrahydride ($SiH_4$) and dinitrogen monoxide ($N_2O$) ($SiH_4$:$N_2O$=4 sccm:800 sccm) are used for a deposition gas, the pressure in a chamber is 40 Pa, the power is 150 W, the power supply frequency is 60 MHz, and the substrate (silicon wafer) temperature is 400° C.

Thus, the second gate insulating film 4024b is a silicon oxide film having higher hydrogen concentration than the first gate insulating film 4024a. In the second gate insulating film 4024b formed with use of a deposition gas containing silicon hydride and oxygen, the hydrogen concentration is higher than the fluorine concentration. It is preferable that the fluorine concentration be lower than $1\times10^{20}$ atoms/cm$^3$ and the hydrogen concentration be $1\times10^{20}$ atoms/cm$^3$ or higher. The thickness of the second gate insulating film 4024b may be about greater than or equal to 50 nm and less than or equal to 100 nm.

The first gate insulating film 4024a can be made a dense film when the first gate insulating film 4024a is formed by a plasma CVD method with use of a deposition gas containing silicon fluoride and oxygen. The dense first gate insulating film 4024a can prevent hydrogen contained in the second gate insulating film 4024b which is stacked over the first gate insulating film 4024a from entering the oxide semiconductor film.

Since the second gate insulating film 4024b formed over and in contact with the source electrode layer, the drain electrode layer, and the first gate insulating film 4024a is formed by a plasma CVD method with use of a deposition gas containing silicon hydride and oxygen, the second gate insulating film 4024b can be formed at relatively high deposition rate and thus made thicker than the first gate insulating film 4024a, which is advantageous in productivity. Further, the deposition gas does not contain fluorine, chlorine, and the like which corrode the source electrode layer and the drain electrode layer which are in contact with the second gate insulating film 4024b; thus, the second gate insulating film 4024b can be formed without roughening surfaces of the source electrode layer and the drain electrode layer.

Therefore, in the manufacturing process of the transistors 4010 and 4011, a defective shape due to corrosion of the source electrode layer and the drain electrode layer, poor coverage of the second gate insulating film 4024b stacked thereover, or the like can be prevented, leading to manufacturing a highly reliable semiconductor device in a high yield.

The insulating layer 4021 can be formed using an inorganic insulating material or an organic insulating material. The insulating layer 4021 may be formed using a heat-resistant organic insulating material such as an acrylic resin, polyimide, a benzocyclobutene-based resin, polyamide, or an epoxy resin, which is preferable as a planarizing insulating film. As well as such an organic insulating material, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021; the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from the light source or the display element. Therefore, the substrate and the thin films such as the insulating film and the conductive film provided in the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have a light-transmitting property or a light-reflecting property, which depends on the direction in which light is extracted, the position where the electrode layer is provided, and the pattern structure of the electrode layer.

The first electrode layer 4030 and the second electrode layer 4031 can be each formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the first electrode layer 4030 and the second electrode layer 4031 can be each formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

Since the transistor is easily broken owing to static electricity or the like, a protective circuit for protecting the driver circuit is preferably provided. The protective circuit is preferably formed using a non-linear element.

In this manner, by using any of the transistors exemplified in Embodiment 1, a highly reliable semiconductor device can be provided.

This embodiment can be implemented in appropriate combination with any of the structures described in the other embodiments.

Embodiment 3

A semiconductor device including an image sensor function for reading data of an object can be manufactured with the use of any transistor exemplified in Embodiment 1.

Figure 7A:
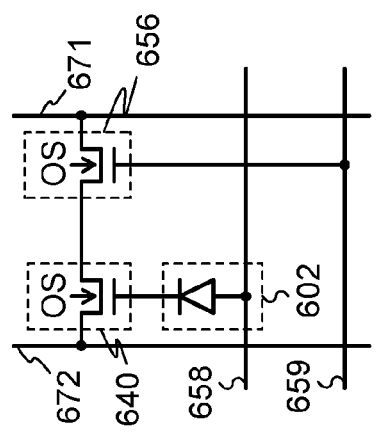
FIGS. 7A and 7B illustrate one embodiment of a semiconductor device.

An example of a semiconductor device having an image sensor function is illustrated in FIG. 7A. FIG. 7A illustrates an equivalent circuit of a photo sensor, and FIG. 7B is a cross-sectional view illustrating part of the photo sensor.

One electrode of a photodiode 602 is electrically connected to a photodiode reset signal line 658, and the other electrode thereof is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted with a symbol "OS" so that it can be identified as a transistor including an oxide semiconductor film. The transistor 640 and the transistor 656 in FIG. 7A are transistors each including an oxide semiconductor film.

Figure 7B:
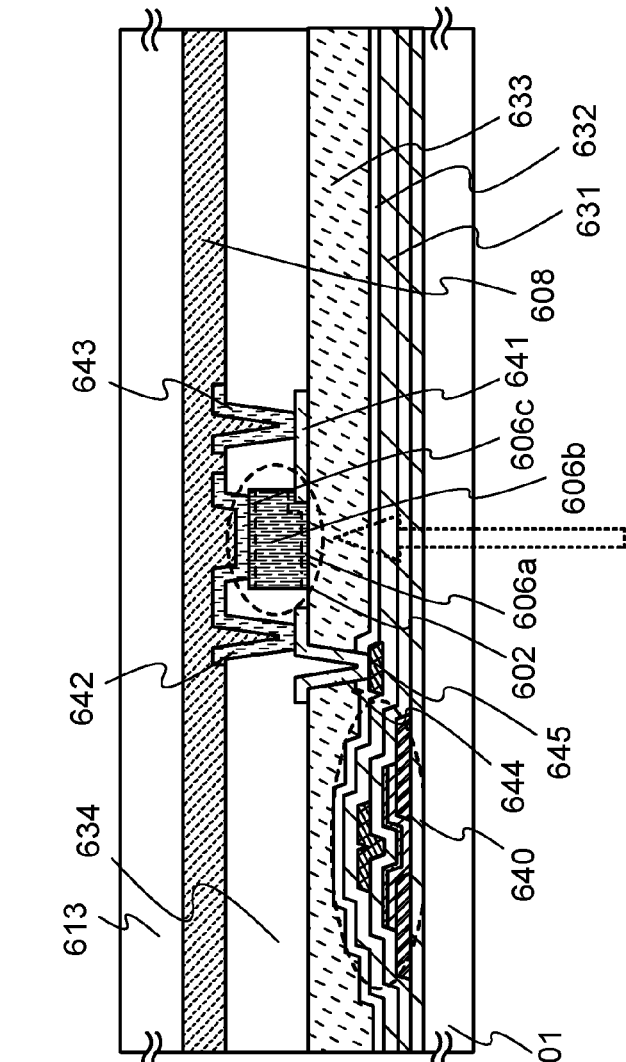

FIG. 7B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with the use of an adhesion layer 608.

An insulating film 631, a protective insulating film 632, a first interlayer insulating layer 633, and a second interlayer insulating layer 634 are provided over the transistor 640. The photodiode 602 is provided over the first interlayer insulating layer 633. In the photodiode 602, a first semiconductor layer 606a, a second semiconductor layer 606b, and a third semiconductor layer 606c are stacked in this order over the first interlayer insulating layer 633 between an electrode layer 641 provided over the first interlayer insulating layer 633 and an electrode layer 642 provided over the second interlayer insulating layer 634.

In this embodiment, any of the transistors exemplified in Embodiment 1 can be applied to the transistor 640. In the transistor 640 and the transistor 656, variation in electrical characteristics is suppressed, and the transistor 640 and the transistor 656 are electrically stable. Accordingly, a highly reliable semiconductor device can be provided as the semiconductor device of this embodiment described in FIGS. 7A and 7B.

The electrode layer 641 is electrically connected to a conductive layer 643 formed in the second interlayer insulating layer 634, and the electrode layer 642 is electrically connected to a gate electrode 645 through the electrode layer 644. The gate electrode 645 is electrically connected to the gate electrode of the transistor 640, and the photodiode 602 is electrically connected to the transistor 640.

Here, a pin photodiode in which a semiconductor layer having a p-type conductivity as the first semiconductor layer 606a, a high-resistance semiconductor layer (an i-type semiconductor layer) as the second semiconductor layer 606b, and a semiconductor layer having an n-type conductivity as the third semiconductor layer 606c are stacked is illustrated as an example.

The first semiconductor layer 606a is a p-type semiconductor layer and can be formed using an amorphous silicon film containing an impurity element imparting the p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor layer 606a is preferably formed to have a thickness greater than or equal to 10 nm and less than or equal to 50 nm.

The second semiconductor layer 606b is an i-type semiconductor layer (an intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting the n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion implantation method. Heating or the like may be conducted after introducing the impurity element by an ion implantation method or the like in order to diffuse the impurity element. In that case, as a method of forming the amorphous silicon film, an LPCVD method, a vapor deposition method, a sputtering method, or the like may be used. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor, and may be formed using a polycrystalline semiconductor, or a micro crystalline semiconductor (a semi-amorphous semiconductor: SAS).

The microcrystalline semiconductor belongs to a metastable state of an intermediate between amorphous and single crystalline, considering Gibbs free energy. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, that is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. The semiconductor contains hydrogen or halogen of at least 1 atomic % to terminate a dangling bond. Moreover, microcrystalline silicon is made to contain a rare gas element such as helium, neon, argon, or krypton to further enhance lattice distortion, whereby stability is increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed by diluting silicon hydride such as $SiH_4$, $Si_2H_6$, $SiH_2Cl_2$, or $SiHCl_3$ or a silicon halide such as $SiCl_4$ or $SiF_4$ with hydrogen. Further, with a dilution with one or plural kinds of rare gas elements selected from helium, argon, krypton, and neon, in addition to silicon hydride and hydrogen, the microcrystalline semiconductor film can be formed. In that case, the flow ratio of hydrogen to silicon hydride is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by a photoelectric effect is lower than that of electrons, a pin photodiode exhibits better characteristics when a surface on the p-type semiconductor layer side (in the direction indicated by an arrow) is used as a light-receiving plane. Here, an example in which light received by the photodiode 602 from a surface of the substrate 601, over which the pin photodiode is formed, is converted into electric signals is described. Further, light from the semiconductor layer having a conductivity type opposite from that of the semiconductor layer on the light-receiving plane is disturbance light; therefore, the electrode layer on the semiconductor layer having the opposite conductivity type is preferably formed from a light-blocking conductive film. Note that a surface on the n-type semiconductor layer side can alternatively be used as the light-receiving plane.

For reduction of the surface roughness, an insulating layer functioning as a planarizing insulating film is preferably used as the first interlayer insulating layer 633 and the second interlayer insulating layer 634. The first interlayer insulating layer 633 and the second interlayer insulating layer 634 can be formed using, for example, an organic insulating material such as polyimide, an acrylic resin, a benzocyclobutene-based resin, polyamide, or an epoxy resin. As well as such an organic insulating material, it is possible to use a single layer or multi layers of a low-dielectric constant material (a low-k material), a siloxane-based resin, phosphosilicate glass (PSG), borophosphosilicate glass (BPSG), and the like.

The insulating film 631, the protective insulating film 632, the first interlayer insulating layer 633, and the second interlayer insulating layer 634 can be formed using an insulating material by a sputtering method, a spin coating method, a dipping method, spray coating, a droplet discharge method (e.g., an inkjet method, screen printing, or offset printing), roll coating, curtain coating, knife coating, or the like depending on the material.

With detection of light that enters the photodiode 602, data on an object to be detected can be read. A light source such as a backlight can be used for the data reading on the object.

The transistor whose example is described in Embodiment 1 can be used as the transistor 640. A dense silicon oxide film which has a low hydrogen concentration and contains fluorine is formed with use of a deposition gas containing silicon fluoride and oxygen; over the dense silicon oxide film containing fluorine, a silicon oxide film having a higher deposition rate than the dense silicon oxide film is formed with use of a deposition gas containing silicon hydride and oxygen; and the formed films are used as gate insulating films; whereby the transistor 640 can have stable electric characteristics and high reliability.

A semiconductor device can be manufactured in a high yield when the silicon oxide film formed with use of the deposition gas containing silicon hydride and oxygen, which is advantageous in productivity.

This embodiment can be implemented in appropriate combination with any of the structures described in the other embodiments.

Embodiment 4

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic appliances each including the liquid crystal display device described in the above embodiment will be described below.

Figure 8A:
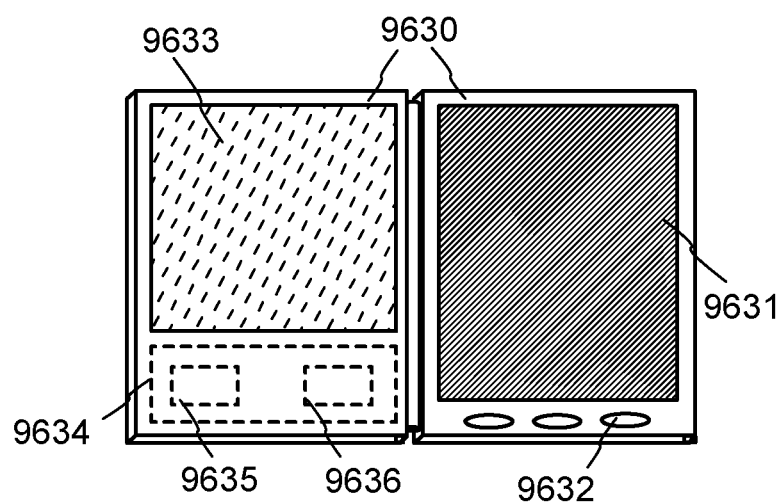
FIGS. 8A and 8B illustrate an electronic device.

FIG. 8A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 8A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that FIG. 8A illustrates an example in which the charge and discharge control circuit 9634 has a battery 9635 and a DCDC converter (hereinafter, abbreviated as a converter) 9636. Any of the semiconductor devices described in the above embodiments is applied to the display portion 9631, whereby a highly reliable electronic book reader can be provided.

In the case where a transflective liquid crystal display device or a reflective liquid crystal display device is used as the display portion 9631, use under a relatively bright condition is assumed; therefore, the structure illustrated in FIG. 8A is preferable because power generation by the solar cell 9633 and charge with the battery 9635 are effectively performed. Since the solar cell 9633 can be provided in a space (a surface or a rear surface) of the housing 9630 as appropriate, the battery 9635 can be efficiently charged, which is preferable. A lithium ion battery may be used as the battery 9635, which provides an advantage of downsizing or the like.

Figure 8B:
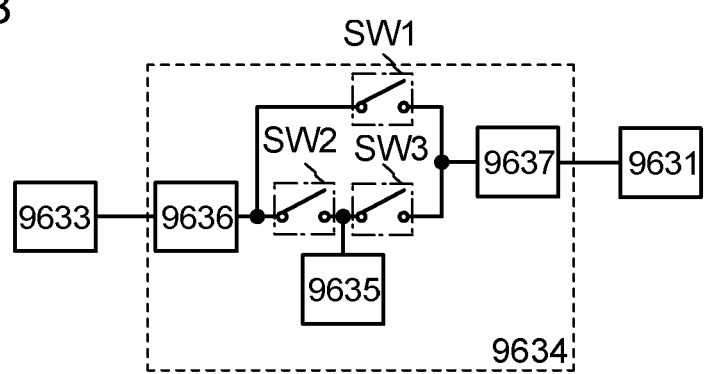

The structure and the operation of the charge and discharge control circuit 9634 illustrated in FIG. 8A are described with reference to a block diagram of FIG. 8B. The solar cell 9633, the battery 9635, the converter 9636, a converter 9637, switches SW1 to SW3, and the display portion 9631 are illustrated in FIG. 8B, and the battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, for example, the switch SW1 is turned off and the switch SW2 is turned on so that charge of the battery 9635 is performed.

Next, operation in the case where power is not generated by the solar cell 9633 using external light is described. The voltage of power accumulated in the battery 9635 is raised or lowered by the converter 9637 with the switch SW3 turned on. Then, power from the battery 9635 is used for the operation of the display portion 9631.

Although the solar cell 9633 is described as an example of a means for charging, the battery 9635 may be charged with another means. The solar cell 9633 may be combined with another means for charging.

Figure 9A:
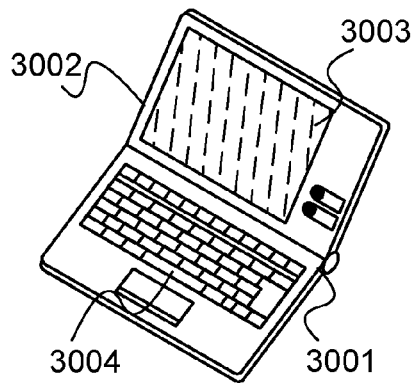
FIGS. 9A to 9F each illustrate an electronic device.

FIG. 9A illustrates a laptop personal computer, which includes a main body 3001, a housing 3002, a display portion 3003, a keyboard 3004, and the like. By applying any of the semiconductor devices described in the above embodiments to the display portion 3003, a highly reliable laptop personal computer can be provided.

Figure 9B:
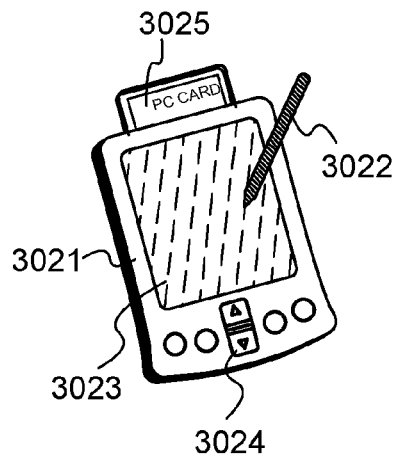

FIG. 9B is a personal digital assistant (PDA), which includes a main body 3021 provided with a display portion 3023, an external interface 3025, operation buttons 3024, and the like. A stylus 3022 is included as an accessory for operation. By applying any of the semiconductor devices described in the above embodiments to the display portion 3023, a highly reliable personal digital assistant (PDA) can be provided.

Figure 9C:
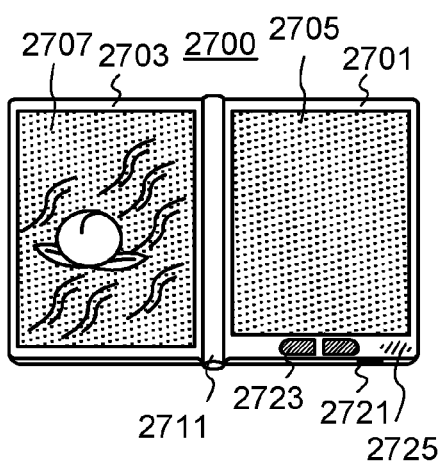

FIG. 9C illustrates an example of an electronic book reader. For example, an electronic book reader 2700 includes two housings, i.e., a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be handled like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 9C) displays text and the left display portion (the display portion 2707 in FIG. 9C) displays images. By applying any of the semiconductor devices described in the above embodiments to the display portions 2705 and 2707, a highly reliable electronic book reader can be provided as the electronic book reader 2700.

FIG. 9C illustrates an example in which the housing 2701 is provided with an operation portion and the like. For example, the housing 2701 is provided with a power switch 2721, operation keys 2723, a speaker 2725, and the like. With the operation keys 2723, pages can be turned. A keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may be equipped with a function of an electronic dictionary.

The electronic book reader 2700 may have a structure capable of wirelessly transmitting and receiving data. Through wireless communication, book data or the like can be purchased and downloaded from an electronic book server.

Figure 9D:
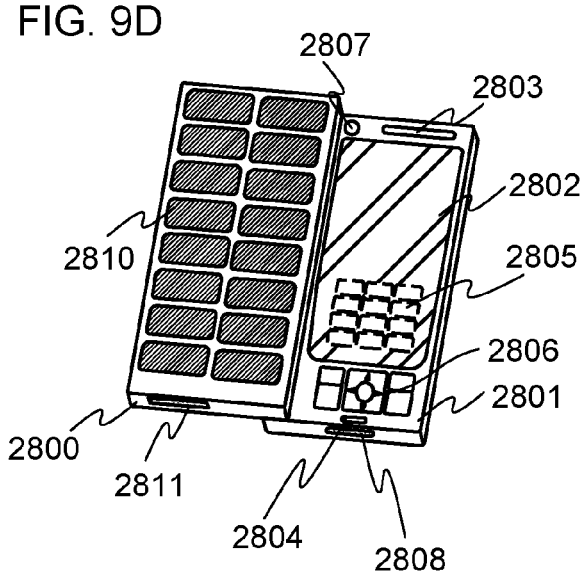

FIG. 9D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charging the mobile phone, an external memory slot 2811, and the like. An antenna is incorporated in the housing 2801. By applying any of the semiconductor devices described in the above embodiments to the display panel 2802, a highly reliable mobile phone can be provided.

Further, the display panel 2802 is provided with a touch panel. A plurality of operation keys 2805 which is displayed as images is illustrated by dashed lines in FIG. 9D. A boosting circuit by which a voltage output from the solar cell 2810 is increased to be sufficiently high for each circuit is also provided.

On the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 9D can overlap with each other by sliding; thus, the size of the mobile phone can be decreased, which makes the mobile phone suitable for being carried.

The external connection terminal 2808 can be connected to an AC adapter and various types of cables such as a USB cable, and charging and data communication with a personal computer are possible. Moreover, a large amount of data can be stored and moved with a storage medium inserted into the external memory slot 2811.

Further, in addition to the above functions, an infrared communication function, a television reception function, or the like may be equipped.

Figure 9E:
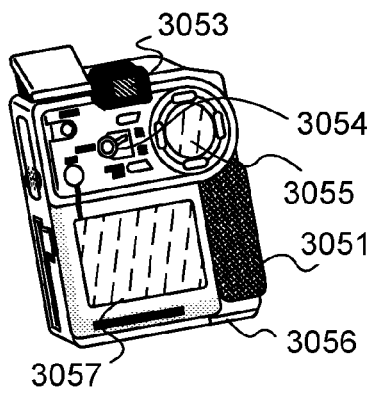

FIG. 9E illustrates a digital video camera which includes a main body 3051, a display portion A 3057, an eyepiece portion 3053, an operation switch 3054, a display portion B 3055, a battery 3056, and the like. By applying any of the semiconductor devices described in the above embodiments to the display portion A 3057 and the display portion B 3055, a highly reliable digital video camera can be provided.

Figure 9F:
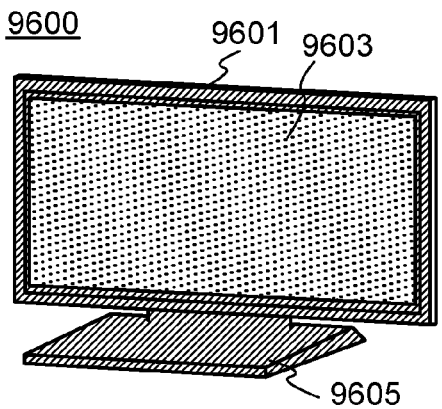

FIG. 9F illustrates an example of a television set. In a television set 9600, a display portion 9603 is incorporated in a housing 9601. The display portion 9603 can display images. In FIG. 9F, the housing 9601 is supported by a stand 9605. By applying any of the semiconductor devices described in the above embodiments to the display portion 9603, a high reliable television set can be provided as the television set 9600.

The television set 9600 can be operated by an operation switch of the housing 9601 or a separate remote controller. Further, the remote controller may be provided with a display portion for displaying data output from the remote controller.

The television set 9600 is provided with a receiver, a modem, and the like. With the receiver, general television broadcasting can be received. Moreover, when the display device is connected to a communication network with or without wires via the modem, one-way (from sender to receiver) or two-way (between sender and receiver or between receivers) data communication can be performed.

This embodiment can be implemented in appropriate combination with any of the structures described in the other embodiments.

Example 1

In this example, in a transistor which is one embodiment of the present invention, a silicon oxide film (a silicon oxide film 1) which can be used as a first gate insulating film and a silicon oxide film (a silicon oxide film 2) which can be used as a second gate insulating film are manufactured, and the results of evaluating film characteristics thereof are shown.

Manufacturing methods of the first gate insulating film (silicon oxide film 1) and the second gate insulating film (silicon oxide film 2) in this example will be described below.

The silicon oxide film 1 and the silicon oxide film 2 were formed by a plasma CVD method over a silicon wafer.

As the silicon oxide film 1, a 200-nm-thick silicon oxide film was formed by a plasma CVD method over a silicon wafer. The deposition conditions of the silicon oxide film 1 were as follows: silicon tetrafluoride ($SiF_4$), dinitrogen monoxide ($N_2O$), and argon (Ar) ($SiF_4:N_2O:Ar=6$ sccm: 1000 sccm: 1000 sccm) were used for the deposition gas, the pressure in a chamber was 133 Pa, the power was 800 W, the power supply frequency was 60 MHz, the substrate (silicon wafer) temperature was 400° C., and the distance between a substrate and an electrode was 7 mm. The deposition rate was 0.5 nm/min to 1 nm/min.

As the silicon oxide film 2, a 200-nm-thick silicon oxide film was formed by a plasma CVD method over a silicon wafer. The deposition conditions of the silicon oxide film 2 were as follows: silicon tetrahydride ($SiH_4$) and dinitrogen monoxide ($N_2O$) ($SiF_4:N_2O=4$ sccm:800 sccm) were used for the deposition gas, the pressure in a chamber was 40 Pa, the power was 150 W, the power supply frequency was 60 MHz, the substrate (silicon wafer) temperature was 400° C., and the distance between a substrate and an electrode was 28 mm. The deposition rate was 30 nm/min to 50 nm/min.

Figure 11:
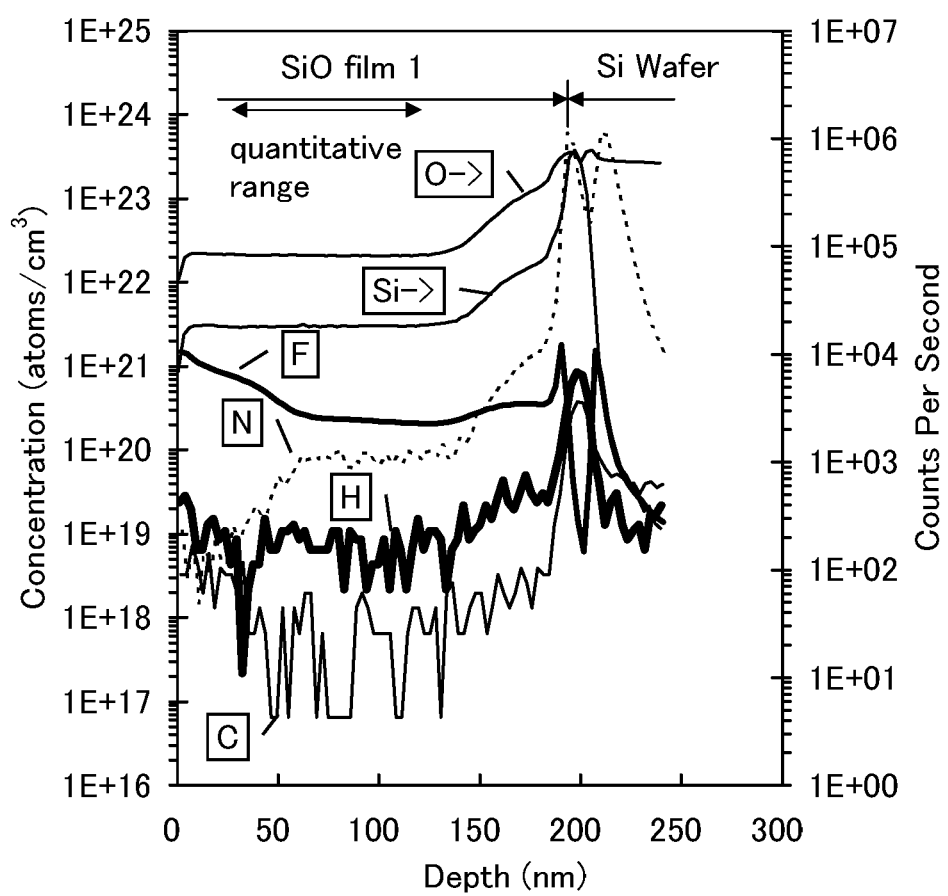
FIG. 11 shows measurement results of SIMS in an example.
Figure 12:
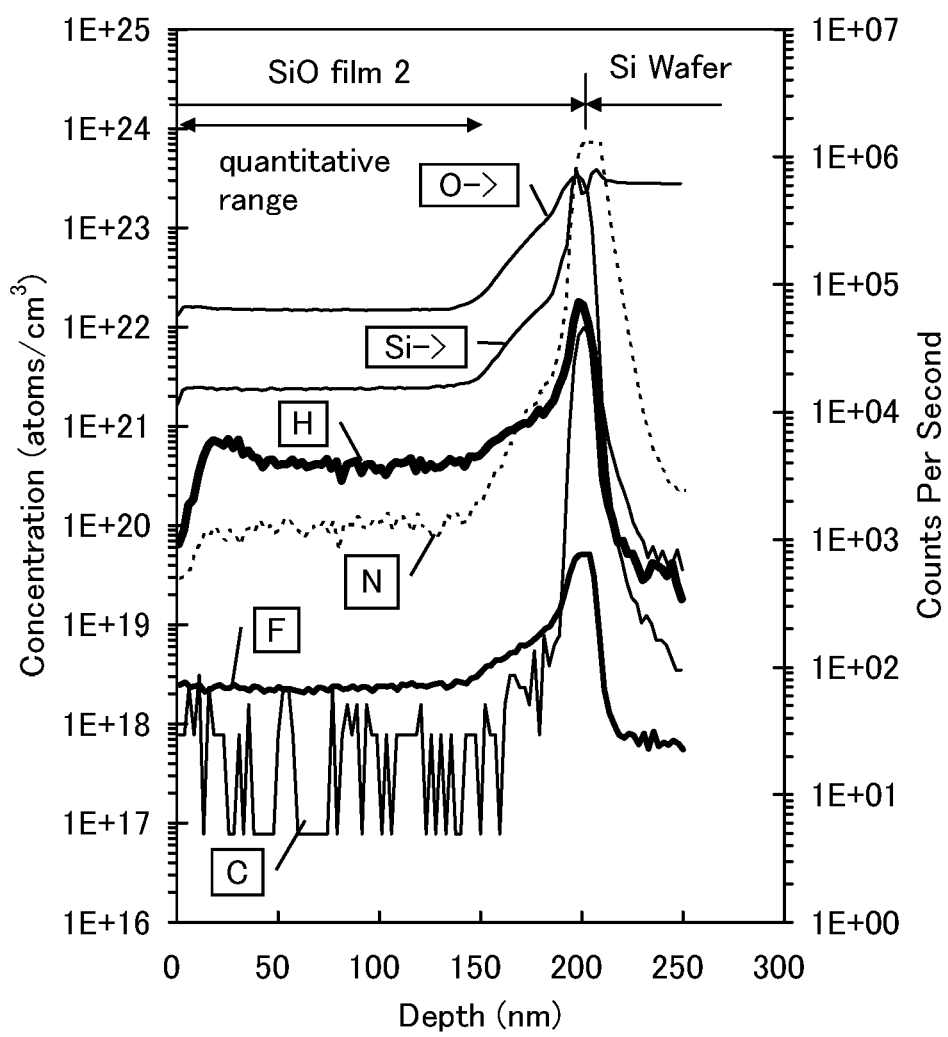
FIG. 12 shows measurement results of SIMS in the example.

The formed silicon oxide film 1 and silicon oxide film 2 were analyzed by secondary ion mass spectrometry (SIMS). FIG. 11 shows the measurement result by SIMS of the silicon oxide film 1, and FIG. 12 shows the measurement result by SIMS of the silicon oxide film 2. In FIG. 11 and FIG. 12, the vertical axis represents the concentration and the horizontal axis represents the depth from the surface of the silicon oxide film.

As FIG. 11 shows, in the silicon oxide film 1 formed using the deposition gas containing silicon fluoride and oxygen, the hydrogen concentration is lower than the fluorine concentration. The fluorine concentration is $1\times10^{20}$ atoms/cm$^3$ or higher and the hydrogen concentration is lower than $1\times10^{20}$ atoms/cm$^3$. Specifically, the range of the fluorine concentration was about $2\times10^{20}$ atoms/cm$^3$ to $1.4\times10^{21}$ atoms/cm$^3$, and the range of the hydrogen concentration was suppressed to as low as about $1\times10^{18}$ atoms/cm$^3$ to $5\times10^{19}$ atoms/cm$^3$.

On the other hand, as FIG. 12 shows, in the silicon oxide film 2 formed using the deposition gas containing silicon hydride and oxygen, the hydrogen concentration is higher than the fluorine concentration. The fluorine concentration is lower than $1\times10^{20}$ atoms/cm$^3$ and the hydrogen concentration is $1\times10^{20}$ atoms/cm$^3$ or higher. The range of the fluorine concentration was about $2\times10^{18}$ atoms/cm$^3$ to $1\times10^{19}$ atoms/cm$^3$, and the range of the hydrogen concentration was suppressed to as low as about $1\times10^{20}$ atoms/cm$^3$ to $1\times10^{21}$ atoms/cm$^3$.

Note that in FIG. 11 and FIG. 12, the fluorine concentration and the hydrogen concentration fall within the quantitative range.

As described above, it was confirmed that the silicon oxide film 1 was a silicon oxide film in which the fluorine concentration was higher than the hydrogen concentration and that the hydrogen concentration was suppressed to be low. It was also confirmed that, as for the fluorine concentration, the silicon oxide film 1 formed using the deposition gas containing silicon fluoride and oxygen had higher fluorine concentration than the silicon oxide film 2 formed using the deposition gas containing silicon hydride and oxygen; and as for the hydrogen concentration, the hydrogen concentration of the silicon oxide film 1 formed using the deposition gas containing silicon fluoride and oxygen was suppressed to be lower than that of the silicon oxide film 2 formed using the deposition gas containing silicon hydride and oxygen.

On the other hand, the silicon oxide film 2 formed using the deposition gas containing silicon hydride and oxygen has higher deposition rate than the silicon oxide film 1 formed using the deposition gas containing silicon fluoride and oxygen; therefore, the silicon oxide film 2 is advantageous in productivity.

Accordingly, a dense silicon oxide film (the silicon oxide film 1) having a low hydrogen concentration and containing fluorine is formed using the deposition gas containing silicon fluoride and oxygen to be in contact with an oxide semiconductor film; over the dense silicon oxide film (the silicon oxide film 1) containing fluorine, a silicon oxide film (the silicon oxide film 2) having high deposition rate is stacked using silicon hydride; and the films are used as gate insulating films, whereby a transistor having stable electric characteristics and high reliability can be obtained.

Further, a silicon oxide film formed using silicon hydride which is advantageous in productivity is employed, so that a semiconductor device can be manufactured in a high yield.

This application is based on Japanese Patent Application serial No. 2010-116016 filed with Japan Patent Office on May 20, 2010, the entire contents of which are hereby incorporated by reference.

EXPLANATION OF REFERENCES

400: substrate, 401: gate electrode layer, 402a: first gate insulating film, 402b: second gate insulating film, 403: oxide semiconductor film, 405a: source electrode layer, 405b: drain electrode layer, 406: insulating film, 406a: first insulating film, 406b: second insulating film, 407: insulating film, 410: transistor, 441: oxide semiconductor film, 443: first gate insulating film, 601: substrate, 602: photodiode, 606a: first semiconductor layer, 606b: second semiconductor layer, 606c: third semiconductor layer, 608: adhesion layer, 613: substrate, 631: insulating film, 632: protective insulating film, 633: first interlayer insulating layer, 634: second interlayer insulating layer, 640: transistor, 641: electrode layer, 642: electrode layer, 643: conductive layer, 644: electrode layer, 645: gate electrode, 656: transistor, 658: photodiode reset signal line, 659: gate signal line, 671: photo sensor output signal line, 672: photo sensor reference signal line, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar battery cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece portion, 3054: operation switch, 3055: display portion B, 3056: battery, 3057: display portion A, 4001: first substrate, 4002: pixel portion, 4003: signal line driver circuit, 4004: scan line driver circuit, 4005: sealing material, 4006: second substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: insulating film, 4021: insulating film, 4023: insulating film, 4024a: first gate insulating film, 4024b: second gate insulating film, 4030: first electrode layer, 4031: second electrode layer, 4032: insulating film, 4033: insulating film, 4035: spacer, 4510: bank, 4511: electroluminescent layer, 4513: light-emitting element, 4514: filler, 4612: cavity, 4613: spherical particle, 4614: filler, 4615a: black region, 4615b: white region, 9600: television set, 9601: housing, 9603: display portion, 9605: stand, 9630: housing, 9631: display portion, 9632: operation key, 9633: solar cell, 9634: charge/discharge control circuit, 9635: battery, 9636: converter, 9637: converter

The invention claimed is:
1. A semiconductor device comprising:
an insulating film;
a source electrode layer and a drain electrode layer over the insulating film;
an island-shaped oxide semiconductor film over the insulating film, the source electrode layer, and the drain electrode layer;
an island-shaped first gate insulating film over and in contact with the island-shaped oxide semiconductor film;
a second gate insulating film over the insulating film, the source electrode layer, the drain electrode layer, the island-shaped oxide semiconductor film, and the island-shaped first gate insulating film; and
a gate electrode layer over the second gate insulating film,
wherein the island-shaped first gate insulating film includes a silicon oxide film containing fluorine,
wherein the second gate insulating film contains hydrogen,
wherein a hydrogen concentration of the second gate insulating film is higher than a hydrogen concentration of the island-shaped first gate insulating film, and
wherein a width of the island-shaped oxide semiconductor film is smaller than a width of the gate electrode layer in a direction perpendicular to a direction from the source electrode layer to the drain electrode layer.

2. The semiconductor device according to claim 1, wherein a thickness of the island-shaped first gate insulating film is smaller than a thickness of the second gate insulating film.

3. The semiconductor device according to claim 1, wherein a thickness of the island-shaped first gate insulating film is greater than or equal to 1 nm and less than or equal to 10 nm.

4. The semiconductor device according to claim 1,
wherein a hydrogen concentration in the island-shaped first gate insulating film is lower than a fluorine concentration in the island-shaped first gate insulating film,
wherein the fluorine concentration is greater than or equal to $1 \times 10^{20}$ atoms/cm$^3$, and
wherein the hydrogen concentration is less than $1 \times 10^{20}$ atoms/cm$^3$.

5. The semiconductor device according to claim 1,
wherein a hydrogen concentration in the second gate insulating film is higher than a fluorine concentration in the second gate insulating film,
wherein the fluorine concentration is less than $1 \times 10^{20}$ atoms/cm$^3$, and
wherein the hydrogen concentration is greater than or equal to $1 \times 10^{20}$ atoms/cm$^3$.

6. A semiconductor device comprising:
an insulating film;
a source electrode layer and a drain electrode layer over the insulating film;
an island-shaped oxide semiconductor film over the insulating film, the source electrode layer, and the drain electrode layer;
an island-shaped first gate insulating film over and in contact with the island-shaped oxide semiconductor film;
a second gate insulating film over the insulating film, the source electrode layer, the drain electrode layer, the island-shaped oxide semiconductor film, and the island-shaped first gate insulating film; and
a gate electrode layer over the second gate insulating film,
wherein the island-shaped first gate insulating film includes a silicon oxide film containing fluorine,
wherein the second gate insulating film contains hydrogen, wherein a hydrogen concentration of the second gate insulating film is higher than a hydrogen concentration of the island-shaped first gate insulating film, wherein the insulating film includes a silicon oxide film containing fluorine, and wherein a width of the island-shaped oxide semiconductor film is smaller than a width of the gate electrode layer in a direction perpendicular to a direction from the source electrode layer to the drain electrode layer.

7. The semiconductor device according to claim 6, wherein a thickness of the island-shaped first gate insulating film is smaller than a thickness of the second gate insulating film.

8. The semiconductor device according to claim 6, wherein a thickness of the island-shaped first gate insulating film is greater than or equal to 1 nm and less than or equal to 10 nm.

9. The semiconductor device according to claim 6,
wherein a hydrogen concentration in the island-shaped first gate insulating film is lower than a fluorine concentration in the island-shaped first gate insulating film, wherein the fluorine concentration is greater than or equal to $1 \times 10^{20}$ atoms/cm$^3$, and wherein the hydrogen concentration is less than $1 \times 10^{20}$ atoms/cm$^3$.

10. The semiconductor device according to claim 6,
wherein a hydrogen concentration in the second gate insulating film is higher than a fluorine concentration in the second gate insulating film, wherein the fluorine concentration is less than $1 \times 10^{20}$ atoms/cm$^3$, and wherein the hydrogen concentration is greater than or equal to $1 \times 10^{20}$ atoms/cm$^3$.

11. A semiconductor device comprising:
an insulating film;
a source electrode layer and a drain electrode layer over the insulating film;
an island-shaped oxide semiconductor film over the insulating film, the island-shaped oxide semiconductor film electrically connected to the source electrode layer and the drain electrode layer;
a first gate insulating film in contact with the island-shaped oxide semiconductor film;
a second gate insulating film in contact with the first gate insulating film; and
a gate electrode layer, wherein the gate electrode layer and the island-shaped oxide semiconductor film overlap with each other, wherein the first gate insulating film includes a silicon oxide film containing fluorine, wherein the second gate insulating film contains hydrogen and fluorine, wherein a hydrogen concentration of the second gate insulating film is higher than a hydrogen concentration of the first gate insulating film, and wherein a width of the island-shaped oxide semiconductor film is smaller than a width of the gate electrode layer in a direction perpendicular to a direction from the source electrode layer to the drain electrode layer.

12. The semiconductor device according to claim 11, wherein the first gate insulating film is island-shaped.

13. The semiconductor device according to claim 11, wherein a thickness of the first gate insulating film is smaller than a thickness of the second gate insulating film.

14. The semiconductor device according to claim 11, wherein a thickness of the first gate insulating film is greater than or equal to 1 nm and less than or equal to 10 nm.

15. The semiconductor device according to claim 11,
wherein the hydrogen concentration of the first gate insulating film is lower than a fluorine concentration of the first gate insulating film, wherein the fluorine concentration of the first gate insulating film is greater than or equal to $1 \times 10^{20}$ atoms/cm$^3$, and wherein the hydrogen concentration of the first gate insulating film is less than $1 \times 10^{20}$ atoms/cm$^3$.

16. The semiconductor device according to claim 11,
wherein the hydrogen concentration of the second gate insulating film is higher than a fluorine concentration of the second gate insulating film, wherein the fluorine concentration of the second gate insulating film is less than $1 \times 10^{20}$ atoms/cm$^3$, and wherein the hydrogen concentration of the second gate insulating film is greater than or equal to $1 \times 10^{20}$ atoms/cm$^3$.

* * * * *